US009880474B2

(12) United States Patent
Patra

(10) Patent No.: US 9,880,474 B2
(45) Date of Patent: Jan. 30, 2018

(54) SYSTEM FOR PRODUCING STRUCTURES IN A SUBSTRATE

(71) Applicant: Carl Zeiss SMT GmbH, Oberkochen (DE)

(72) Inventor: Michael Patra, Oberkochen (DE)

(73) Assignee: Carl Zeiss SMT GmbH, Oberkochen (DE)

(*) Notice: Subject to any disclaimer, the term of this patent is extended or adjusted under 35 U.S.C. 154(b) by 4 days.

(21) Appl. No.: 14/939,536

(22) Filed: Nov. 12, 2015

(65) Prior Publication Data

US 2016/0062244 A1  Mar. 3, 2016

Related U.S. Application Data

(63) Continuation of application No. PCT/EP2014/059944, filed on May 15, 2014.

(30) Foreign Application Priority Data

May 16, 2013  (DE) .................. 10 2013 209 093

(51) Int. Cl.
*G03B 27/42* (2006.01)
*G03F 7/20* (2006.01)
*G03F 1/70* (2012.01)

(52) U.S. Cl.
CPC ............ *G03F 7/70091* (2013.01); *G03F 1/70* (2013.01); *G03F 7/70191* (2013.01); *G03F 7/70433* (2013.01); *G03F 7/70558* (2013.01)

(58) Field of Classification Search
CPC .... G03F 7/70191; G03F 1/70; G03F 7/70558; G03F 7/70433; G03F 7/70091; G03F 7/20; G03F 1/36; G03F 7/70625; G03F 7/70075; G03F 7/70291; G03F 1/24; G03F 1/78; G03F 7/702; G03F 1/38; G03F 1/50; G03F 7/2063; G03F 7/70058; G03F 7/70066; G03F 7/70
See application file for complete search history.

(56) References Cited

U.S. PATENT DOCUMENTS

2007/0103665 A1* 5/2007 Zimmerman .......... G02B 7/346
                                                       355/68
2011/0096317 A1  4/2011  Stuetzle et al.
2012/0075605 A1  3/2012  Chen
2012/0242968 A1  9/2012  Layh et al.

FOREIGN PATENT DOCUMENTS

DE        102 14 247 A1    10/2003
DE   10 2011 005 881 A1     5/2012
DE   10 2011 006 189 A1     6/2012
DE   10 2012 207 572 A1     5/2013
EP         0 952 491 A2    10/1999
WO     WO 2013/097897 A1    7/2013

OTHER PUBLICATIONS

International Search Report, with translation, for corresponding PCT Appl No. PCT/EP2014/059944, dated Aug. 20, 2014.

* cited by examiner

*Primary Examiner* — Mesfin Asfaw
(74) *Attorney, Agent, or Firm* — Fish & Richardson P.C.

(57) ABSTRACT

The disclosure provides a system for producing structures in a substrate. The system includes a projection exposure system. The projection exposure system includes a projection optical unit and an illumination system.

20 Claims, 16 Drawing Sheets

SYSTEM FOR PRODUCING STRUCTURES IN A SUBSTRATE

CROSS-REFERENCE TO RELATED APPLICATIONS

This patent application claims is a continuation of, and claims priority to under 35 U.S.C. §120 to, international application serial number PCT/EP2014/059944, which claims benefit under 35 U.S.C. §119 of German patent application DE 10 2013 209 093.5. The disclosures of these applications are incorporated by reference in their entirety.

BACKGROUND

The disclosure relates to a system for producing structures in a substrate.

BACKGROUND

With the use of masks produced using some known lithographic projection exposure systems, high-frequency errors of the structures which are printed on a wafer occur on account of inhomogeneities of the illumination of the mask in the illumination system used. In this context, "high-frequency" means with a higher spatial frequency than corresponds to the possible resolution of an intensity variation device present in the illumination system. At a specific number of locations, the structures are printed with the desired widths, but deviations of the printed structure widths from the desired structure widths occur between these locations.

SUMMARY

The disclosure seeks to provide an improved system including a projection exposure apparatus for producing structures in wafers.

In accordance with a first aspect, the disclosure provides a system, including:
  a projection exposure apparatus, including:
    a projection optical unit for imaging an object field into an image field;
    a mask holder for holding a lithography mask arrangeable in the object field, wherein the mask holder is displaceable along a scan direction;
    a substrate holder for holding a substrate in the image field, wherein the substrate holder is displaceable along the scan direction;
    an illumination system for generating and guiding illumination light toward the object field, wherein with the illumination system at the object field the illumination light is providable with a scan-integrated intensity distribution and a scan-integrated direction distribution as a function of a direction arranged orthogonally to the scan direction;
wherein: a) the lithography mask has mask structures with which substrate structures are producible on the substrate during the imaging via the projection exposure apparatus; b) the size of the mask structures at defined mask design locations is determined from the intensity distribution and from the direction distribution of the illumination light generated by the illumination system at the object field; and c) the size of the mask structure between the mask design locations is given by a sum of an interpolation of the values of the sizes of the mask structures at the mask design locations plus a term which, apart from a proportionality factor, is given by the profile of the scan-integrated intensity distribution.

In accordance with a second aspect, the disclosure provides a system, including:
  a projection exposure apparatus, including:
    a projection optical unit for imaging an object field into an image field;
    a mask holder for holding a lithography mask arrangeable in the object field, wherein the mask holder is displaceable along a scan direction;
    a substrate holder for holding a substrate in the image field, wherein the substrate holder is displaceable along the scan direction;
    an illumination system for generating and guiding illumination light toward the object field, wherein with the illumination system at the object field the illumination light is providable with a scan-integrated intensity distribution and a scan-integrated direction distribution as a function of a direction arranged orthogonally to the scan direction;
wherein: a) the lithography mask has mask structures with which substrate structures are producible on the substrate during the imaging via the projection exposure apparatus; b) the size of the mask structures on the lithography mask at defined mask design locations is determined from the intensity distribution and from the direction distribution of the illumination light generated by the illumination system at the object field; and c) the size of the mask structures on the lithography mask between the mask design locations is an interpolation of the sizes of the mask structures at the mask design locations.

In accordance with a third aspect, the disclosure provides a system, including:
  a projection exposure apparatus, including:
    a projection optical unit for imaging an object field into an image field;
    a mask holder for holding a lithography mask arrangeable in the object field, wherein the mask holder is displaceable along a scan direction;
    a substrate holder for holding a substrate in the image field, wherein the substrate holder is displaceable along the scan direction;
    an illumination system for generating and guiding illumination light toward the object field;
wherein: a) the illumination system has an intensity variation device for varying the scan-integrated intensity distribution of the illumination light at the object field; b) at the object field illumination light is providable with a scan-integrated intensity distribution and with a scan-integrated direction distribution; c) the lithography mask has mask structures with which substrate structures are producible on the substrate during the imaging via the projection exposure apparatus; and d) the lithography mask is subdividable into disjoint regions in which the mask structure size variation is proportional to the scan-integrated intensity variation.

Dependent claims relate to embodiments of the system.

One embodiment of the system provides that the size of the mask structure at at least one location is formed depending on an NILS factor and depending on an MEEF factor, wherein the size of the mask structure on the lithography mask between the mask design locations is given as a sum of an interpolation of the size of the mask structures at the mask design locations plus a term given by the following mathematical relationship:

$$\Delta b(x) = \frac{2 \times CD \times MEEF}{\beta \times NILS} \times \frac{\Delta I(x)}{I}$$

with the parameters:
CD desired structure width on the substrate
MEEF Mask Error Enhancement Factor
NILS Normalized Intensity Logarithm Squared
β absolute value of the magnification scale of the projection optical unit
ΔI(x)/I relative intensity deviation as a function of the x-coordinate.

A further embodiment of the system provides that a number of the mask design locations and a number of the locations at which an independent correction of a scan-integrated intensity is possible via the intensity variation device are identical.

In an advantageous development, the illumination system has an intensity variation device for varying the scan-integrated intensity distribution of the illumination light at the object field, wherein the intensity variation device is settable in such a way that a uniformity of the scan-integrated intensity distribution of the illumination light at the object field is improvable. With the intensity variation device, use is made of a proven device for correcting a nonuniform intensity distribution of the illumination light, wherein the nonuniform intensity distribution can be corrected or made more uniform.

In a further embodiment, the scan-integrated intensity of the illumination light is of identical magnitude at at least three locations of the object field that are spaced apart from one another. In this way, an interpolation complexity for calculating structures on the lithography mask is kept as low.

A further embodiment of the system is distinguished by the fact that the mask structure on the lithography mask is formed depending on an NILS factor and depending on an MEEF factor, wherein the lithography mask is subdividable into disjoint regions in which a dependence of the size of the mask structure on the location x is given by the following mathematical relationship:

$$\Delta b(x) = \frac{2 \times CD \times MEEF}{\beta \times NILS} \times \frac{\Delta I(x)}{I}$$

with the further parameters:
CD desired structure width on the substrate
MEEF Mask Error Enhancement Factor
NILS Normalized Intensity Logarithm Squared
β absolute value of the magnification scale of the projection optical unit
ΔI(x)/I relative intensity deviation as a function of the x-coordinate.

In this way, intensity changes can be converted into structure size changes via a simple mathematical relationship.

A compensation of intensity inequalities of the illumination light via an interpolation between support values and a simple mathematical formula is achieved in this way.

In accordance with one aspect, a method for producing a mask for a lithographic projection exposure system is proposed, including the following steps:
a) setting an intensity variation device in such a way that a relative uniform illumination intensity is provided;
b) determining an illumination direction distribution at a defined number of mask design locations on the mask as a function of a first coordinate after averaging over a second coordinate;
c) calculating mask structure sizes at the mask design locations, such that structures of the desired size are obtained in the resist image;
d) creating the mask, wherein the structure size on the mask at a location is given by a defined interpolation of structure sizes on the mask at the mask design locations.

In accordance with one further aspect, a method for producing a mask for a lithographic projection exposure system is proposed, including the following steps:
a) setting an intensity variation device in such a way that a relatively uniform illumination intensity is provided;
b) determining an illumination direction distribution at a defined number of mask design locations on the mask as a function of a first coordinate after averaging over a second coordinate;
c) calculating that structures of the desired size are obtained in the resist image;
d) determining the illumination intensity at a relatively large number of locations; and
e) creating the mask taking account of a correction of the structure sizes in accordance with the following mathematical relationship:

$$\Delta b(x) = \frac{2 \times CD \times MEEF}{\beta \times NILS} \times \frac{\Delta I(x)}{I}$$

with the parameters:
Δb correction of the structure size
CD desired structure width
MEEF Mask Error Enhancement Factor
NILS Normalized Intensity Logarithm Squared
β magnification scale
ΔI(x)/I residual intensity error as a function of the x-coordinate.

In accordance with one further aspect, a method for producing a mask for a lithographic projection exposure system is proposed, including the following steps:
a) setting an intensity variation device in such a way that a relatively s uniform illumination intensity is provided;
b) determining an illumination direction distribution at a defined number of mask design locations on the mask as a function of a first coordinate after averaging over a second coordinate;
c) calculating structure sizes at the mask design locations, such that structures of the desired size are obtained in the resist image;
d) determining the illumination intensity at a relatively large number of locations;
e) interpolating in a defined manner structure sizes on the mask at the two mask design locations closest to each location; and
f) creating the mask taking account of a correction of the structure sizes in accordance with the following mathematical relationship:

$$\Delta b(x) = \frac{2 \times CD \times MEEF}{\beta \times NILS} \times \frac{\Delta I(x)}{I}$$

with the parameters:
Δb correction of the structure size on the mask

CD desired structure width
MEEF Mask Error Enhancement Factor
NILS Normalized Intensity Logarithm Squared
β magnification scale
ΔI(x)/I residual intensity error as a function of the x-coordinate.

In accordance with a further aspect, it is proposed that the method provides that in step b) determining the illumination direction distribution is carried out at all locations at which an independent intensity adaptation is possible. Advantageously, in this way interpolations according to the disclosure are carried out between a high number of locations and as a result even small CD errors are compensated for to a great extent.

In accordance with a further aspect, it is provided that the method in step b) carries out the process of determining the illumination direction distribution at a number of mask design locations (PM) in the range of between three and five. With this specific selection of locations, a reduction of mask design locations is carried out and the computational complexity is significantly reduced as a result.

In accordance with a further aspect, it is provided that the method in step e) carries out between the mask design locations the interpolation of the structure sizes which is one of: linear, quadratic, parabolic. Advantageously, a plurality of known interpolation methods can be carried out as a result, wherein interpolation issues can be taken into account in a highly variable manner as a result.

In accordance with a further aspect, it is proposed that the method provides that in step b) determining the illumination direction distribution is carried out at one or at all locations at which an independent intensity adaptation is possible. Advantageously, it is thereby possible to institute improvement potentials of different magnitudes for the mask correction.

In accordance with further aspects, it is provided that the mask design locations (P) are arranged in the center of the mask +/−⅔ of the reticle radius or one of the locations is arranged at the edge of the mask. In this way, it is advantageously possible to take account of in what region of the mask the correction for the mask is the greatest.

BRIEF DESCRIPTION OF THE DRAWINGS

The disclosure is described in detail below with further features and advantages with reference to a number of figures. In this case, all described or illustrated features by themselves or in arbitrary combination form the subject matter of the disclosure, independently of their combination in the patent claims or the dependency reference thereof, and independently of their formulation and illustration in the description and in the figures. The figures are primarily intended to elucidate the principles of the disclosure.

In the figures.

DETAILED DESCRIPTION

Figure 1:
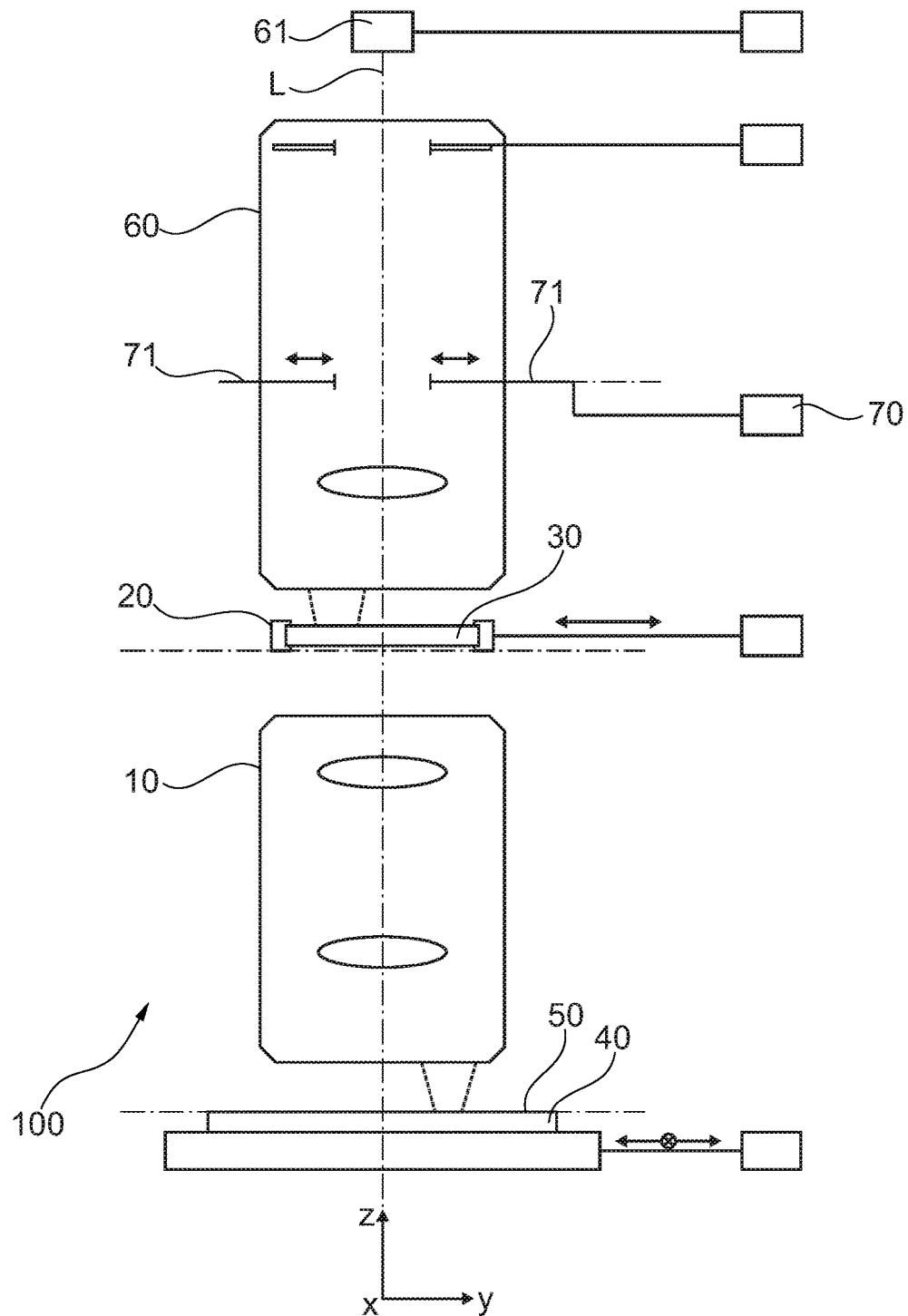
FIG. 1 shows a basic plan view of a projection exposure apparatus.

FIG. 1 shows a conventional projection exposure apparatus 100 or a projection exposure system in a basic plan view illustration. In this case, the projection exposure apparatus 100 includes a projection optical unit 10 for imaging an object field in an object plane onto an image field in an image plane. Furthermore, a movable mask holder 20 is provided, in which a lithography mask 30 (called "mask" or "reticle") is held in a mask plane, wherein the mask holder 20 is preferably displaceable along a displacement direction via a mask displacement drive (not illustrated). The mask plane coincides with an object plane of the projection optical unit 10. Hereinafter, the displacement direction is also referred to as "scan direction" and chosen to be parallel to the y-axis.

Furthermore, a wafer or substrate holder 40 for holding a wafer or substrate 50 in the image field of the projection optical unit 10 is evident, wherein the substrate holder 40 is displaceable along a displacement direction, preferably via a wafer displacement drive (not illustrated).

Mask 30 and wafer 50 are preferably shifted or displaced synchronously with respect to one another. Preferably, the displacement directions are arranged parallel to one another, and the displacement speed of the wafer 50 is equal to the product of the displacement speed of the mask 30 and the magnification scale of the projection optical unit 10. As a result, a mask 30 can be imaged onto a part of the wafer 50, such that during the duration of a displacement process each object point of the mask 30 is imaged onto the same respective image point of the wafer 50. This process is referred to as "scanning", and the projection exposure apparatus is correspondingly referred to as a "scanner".

An illumination system 60 having a radiation cell 61, e.g. in the form of a laser that emits a laser beam having a wavelength of 193 nm, provides for generating illumination light L and guiding it toward the object field. The illumination light L impinges on the object field with a, possibly location-dependent, intensity distribution and direction distribution. The light intensity impinging on a point of the wafer 50 is proportional to the intensity of the illumination at the corresponding point of the object field. If diffractive structures are introduced into the object field, in particular because a mask 30 is situated there, then the intensity in the image field additionally depends on the direction distribution of the illumination light in the object field.

Light impinges on the wafer 50 during scanning The wafer 50 is covered with a photosensitive layer. The chemical properties of said layer at a point change depending on the dose of the light which impinges on said point during the entire exposure process, that is to say that the dose at a point on the wafer 50 is the temporal integral of the intensity of the light at said point. There is only a contribution to the integral as long as the considered point of the wafer 50 is situated within the image field and the corresponding point on the mask 30 is situated within the illuminated region of the object field.

The process is therefore also referred to as "scan integration". The dose at a point on the wafer 50 after the scanning process has been concluded is not dependent on the complete spatial dependence of intensity distribution and direction distribution, but rather only on the corresponding integral over the scan, i.e. over the y-direction. The terms scan-integrated intensity distribution and scan-integrated direction distribution are therefore employed. These two variables are no longer dependent on a coordinate parallel to the displacement direction, but rather only on a coordinate orthogonal thereto. This direction orthogonal to the displacement direction is chosen as the x-axis hereinafter. The points having an identical x-coordinate which lie on a common plane form a straight line parallel to the y-axis, but hereinafter—since the term "straight line" is unusual in this context—are referred to as location. A "point" is therefore identified by two coordinate components, whereas "location" is identified only by one coordinate component.

Provision is furthermore made of an intensity variation device 70. The latter allows an adaptation of the scan-integrated intensity distribution in the object field. In particular, via the intensity variation device 70, it is possible to set a scan-integrated intensity distribution that is location-independent to a great extent at the object field. In particular, an effect of production defects, temporal drifts, aging effects, etc. can be at least partly compensated for via the intensity variation device 70. The direction distribution of the illumination light at the object field can optionally be altered via components of the illumination optical unit 60 that are not illustrated in FIG. 1. The alteration of the direction distribution can lead, in particular even in the absence of production defects, temporal drifts, aging effects, etc., to an alteration of the scan-integrated intensity distribution. If such an alteration occurs, it can then be at least partly compensated for by the intensity variation device 70.

The intensity variation device 70 includes a plurality of fingers 71, for example twenty-five fingers 71. Each finger 71 is displaceable independently of one another along the y-axis. The fingers 71 are fitted near the object plane, in which the object field is arranged, or they are arranged near a plane that is conjugate with respect thereto. If the fingers 71 are suitably displaced, then what can be achieved is that a certain region of the object field is no longer illuminated by illumination light L. Accordingly, the value of the scan-integrated intensity distribution is reduced at these locations.

Each of the fingers 71 has a defined width corresponding to the value of the distance between the individual fingers 71 of the intensity variation device 70. Width and distance relate to the x-coordinate, that is to say are measured orthogonally to the displacement direction of the fingers 71.

Each finger 71 has a curvature at the front edge, that is to say where the finger 71 is pushed into the illumination light L, said curvature corresponding to a projection of the curvature of the object field of the projection lens 10. Uniformity correction apparatuses corresponding to the intensity variation device 70 are known for example from the documents EP 0952491A2, US 2001/0096317A1, U.S. Pat. No. 7,362,413B2 and U.S. Pat. No. 8,629,973B2. The fingers 71 can have a beveled edge region. The fingers 71 can be arranged in an overlapping fashion. The fingers 71 can be arranged on one side of the object field. The fingers 71 can be grouped in two groups each arranged on one side of the object field. The fingers 71 of two different groups of fingers 71 can be arranged in a manner offset with respect to one another.

The lithography mask 30 has structures via which structures are produced in the photosensitive layer on the substrate 50 during the imaging via the projection exposure apparatus 100. Such production of structures in the substrate 50 is also referred to as "printing" of structures. The structures in the photosensitive layer can be transferred into the substrate 50 in a subsequent step, which will not be described any further here. An extent of the structures on the mask 30 is designated as $b_M$. If the structures substantially have the shape of lines, then the thickness of the lines can represent the extent $b_M$. If the structures substantially have the shape of ellipses, then one of the two axes can represent the extent $b_M$. For structures having a different shape, an extent $b_M$ can be defined in an analogous or different way.

The structures produced on the wafer 50 or on the photosensitive layer situated thereon have an extent $b_S$. To a rough approximation, $b_S$ is given by multiplication of $b_M$ by the magnification scale of the projection optical unit 10. However, there is a deviation between this approximated value and the actual extent. The magnitude of said deviation depends on the scan-integrated intensity distribution and the scan-integrated direction distribution in the object field.

Particularly since the scan-integrated intensity distribution and the scan-integrated direction distribution are dependent on a coordinate x orthogonal to a displacement direction, that is to say on the location in the object field, the extent $b_M$ of structures on the mask 30 whose imaging onto the wafer 50 leads to structures having dimensions that are identical among one another is dependent on the coordinate x of the position of a structure on the mask 30, that is to say on the location on the mask 30. Preferably, sizes $b_M$ of such structures on the mask differ among one another by less than 1 nm, in particular by less than 0.5 nm. Preferably, these structures on the mask have the same shape and the same orientation. Preferably, the structures on the mask 30 have the same shape as on the wafer 50, in particular the same orientation.

Via "optical proximity correction (OPC)" or "mask design"—these two terms describe the same process—that size $b_M$ which leads to the production of structures having a predefined size $b_S$ on the substrate 50 can be determined at a defined location on the mask 30 for the structures. OPC is a numerically complex process that involves a long computation time even on a powerful computer.

The lithography mask 30 is distinguished by the fact that the size of the structures $b_M$ at defined locations PM are determinable from the intensity distribution and from the direction distribution of the illumination light generated by the illumination system 60 at the object field, wherein the size of the structures $b_M$ between the locations PM is an interpolation of the sizes of the structures $b_M$ at the locations PM.

In this way, it is possible to compensate for location dependences in the light distribution of the illumination system 60 with the lithography mask 30. This means that an exact calculation of the size $b_M$ of the structures, on the basis of the light distribution at this location, has to be carried out only at few locations, as a result of which a great deal of computational complexity can be saved.

Figure 2:
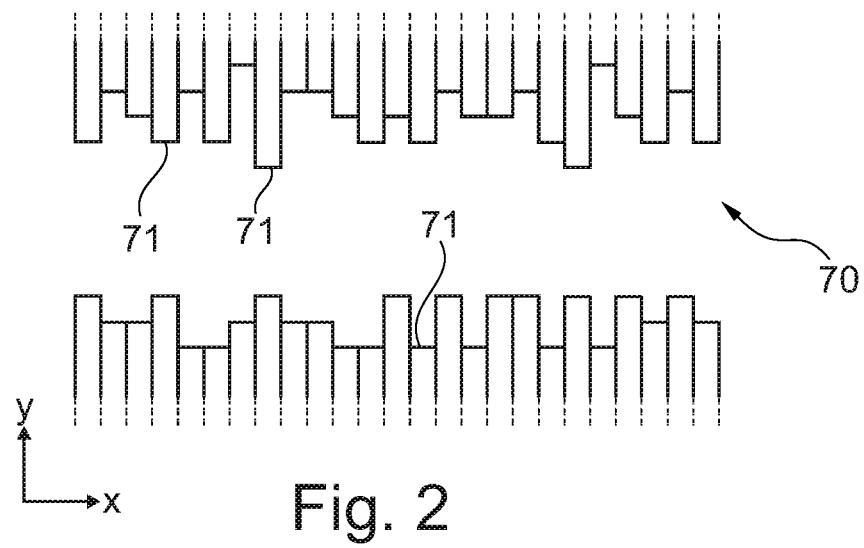
FIG. 2 shows a plan view of a detail of an intensity variation device.

FIG. 2 shows a basic plan view of fingers 71 of the intensity variation device 70. Each of the fingers 71 has a width of approximately 4 mm in the x-direction. Via the fingers 71, that region of the object field which is illuminated by illumination light L can be shortened by the fingers 71 being moved toward one another. This is then referred to as the "scan slot" being shortened. The scan slot can be correspondingly lengthened by the fingers 71 being moved apart.

Correction of the exposure is performed via the fingers 71 embodied in striplike fashion. It is thus evident that although a certain correction of the scan-integrated intensity distribution is possible via the fingers 71, this is limited in a system-dictated manner, as a result of which a completely exact correction of the scan-integrated intensity distribution cannot be carried out via the intensity variation device 70.

Figure 18:
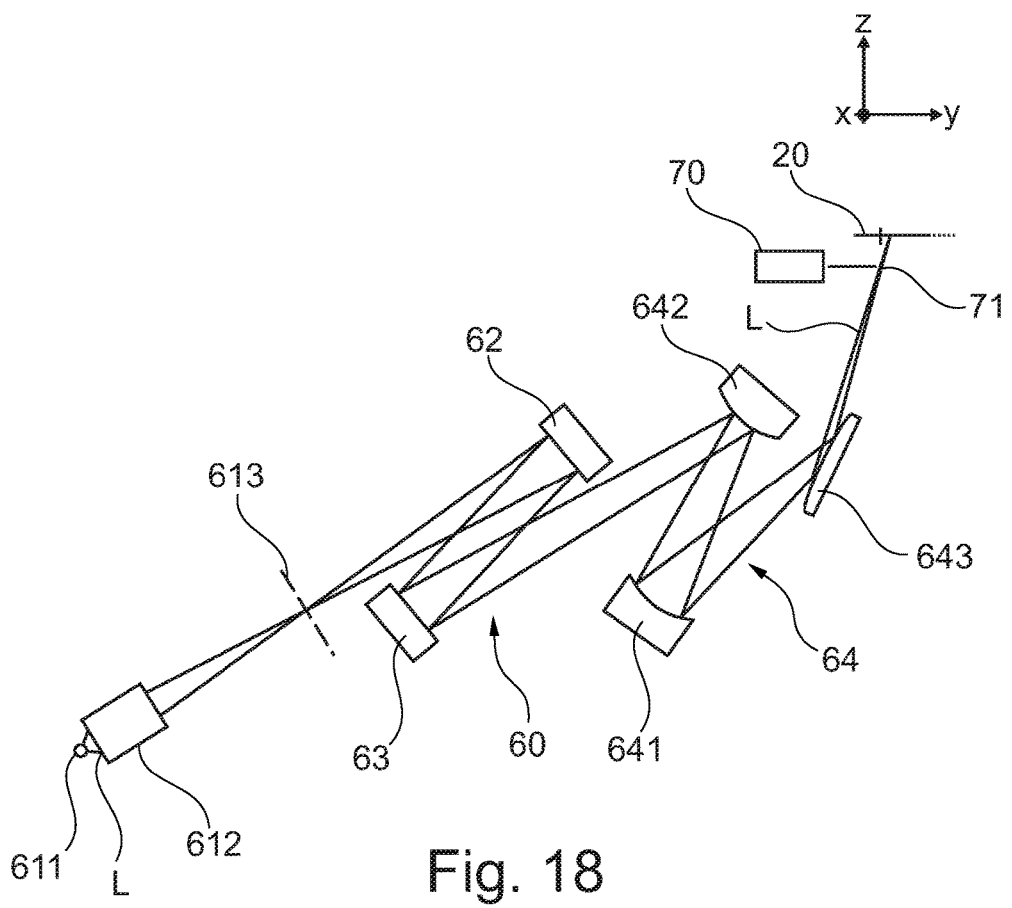
FIG. 18 shows a detailed illustration of an illumination system for the EUV wavelength range.

FIG. 18 shows a detailed illustration of the construction of an illumination system 60 for the EUV wavelength range. A plasma 611 emits illumination light L in a wavelength range of between 5 nm and 30 nm, for example. After focusing by a collector 612, the illumination light L passes through an intermediate focal plane 613, which can be used for separating the EUV illumination light L from undesired radiation or particle constituents. Information concerning such plasmas and collectors is known for example from U.S. Pat. No. 6,859,515 B2 and EP 1 225 481 A2.

After passing through the intermediate focal plane 613, the illumination light L firstly impinges on a field facet mirror 62, which consists of field facets (not illustrated in more specific detail). The light which impinges on a field facet is guided via a pupil facet (not illustrated in more specific detail) of a pupil facet mirror 63. Via a transfer optical unit 64, which consists of three mirrors 641, 642, 643 by way of example in FIG. 18, the illumination light L is guided to the object field. Such an illumination system is known for example from DE 10 2011 076 145 B4. The mirror 643 can be embodied with grazing incidence. The mirror 643 can be embodied without refractive power. Some or all of the mirrors of the transfer optical unit 64 can also be omitted. An intensity variation device 70 having fingers 71 is situated in proximity to the object field, but upstream thereof from the viewpoint of the illumination light L incident on the object field.

The pupil facet mirror 63 is arranged near a pupil plane, that is to say that the choice of the pupil facets via which illumination light L is guided predefines the direction of impingement on the object field. The field facets of the field facet mirror 62 are displaceable, such that illumination light which impinges on a field facet can be guided via a different pupil facet depending on the displacement state. It is thereby possible to alter a direction distribution of illumination light at the object field.

The field facet mirror is arranged in or near a plane that is conjugate with respect to the object field. Each field facet is therefore, at least approximately, imaged into the plane of the object field. Intensity inhomogeneities of the illumination light L incident on a field facet thus lead to an intensity inhomogeneity of the illumination light guided via a specific pupil facet upon impinging on the object field.

The illumination of the field facet mirror 62 and thus also of each individual field facet depends on the properties of the source plasma 611 and of the collector 612. In general, homogenous illumination of the field facet mirror 62 and thus also of the individual field facet is not achievable. Since the pupil facet mirror 63 is arranged in or near a pupil plane, the inhomogeneity leads to a dependence of the direction distribution on the point on the object field, and thus also to a dependence of the scan-integrated direction distribution on the location.

For fundamental physical reasons, therefore, there can be a dependence of the scan-integrated direction distribution on the location on the object field. In addition, effects such as layers on mirrors of the illumination system 60 or geometry factors when guiding the illumination light L in the illumination system 60 can also lead to location dependences of the scan-integrated intensity distribution or of the scan-integrated direction distribution. If the direction distribution is deliberately altered at the object field by the displacement of field facets of the field facet mirror 62, then this can likewise lead to an alteration of the scan-integrated intensity distribution.

These alterations can be predictable, that is to say that they can be independent of e.g. aging effects or thermal drifts. In particular, they can be identical for all projection exposure apparatuses 100 or illumination systems 60 of one type. These alterations can be based on aging effects, thermal drifts or production fluctuations of the illumination system 60 and/or of its components. They can differ in particular between projection exposure apparatuses 100 or illumination systems 60 of one type.

Figure 3:
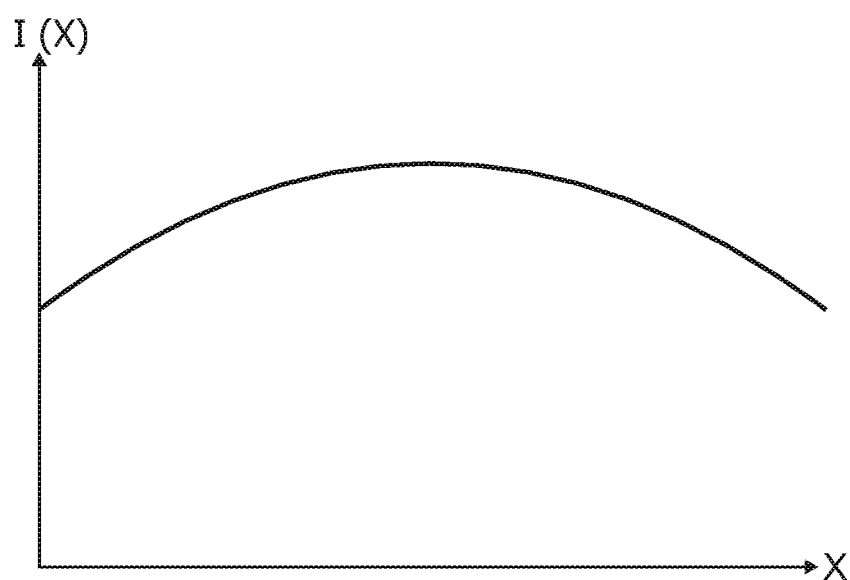
FIG. 3 shows an illustration of a scan-integrated intensity of an illumination before a correction.

FIG. 3 shows in principle a profile of a scan-integrated intensity I of the illumination light, said profile being embodied in a parabolic fashion. The illustrated profile is present before a correction by the fingers 71 of the intensity variation device 70. Of course, an upwardly curved parabola is also conceivable. In particular, a downwardly curved parabola can arise for one displacement state of the field facets of the field facet mirror 62 and an upwardly curved parabola can arise for another displacement state of the field facets.

Figure 4A:
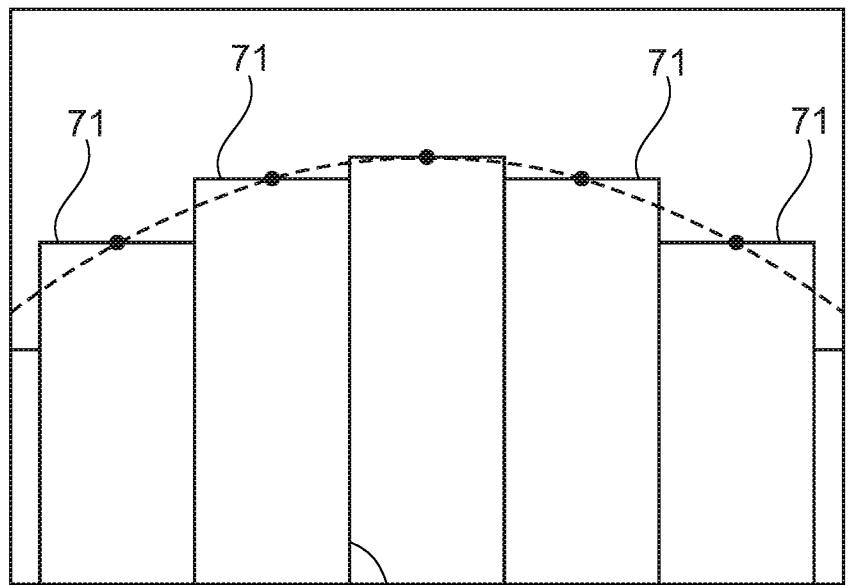
FIGS. 4a and 4b show illustrations of a scan-integrated intensity distribution before and after a correction.
Figure 4B:
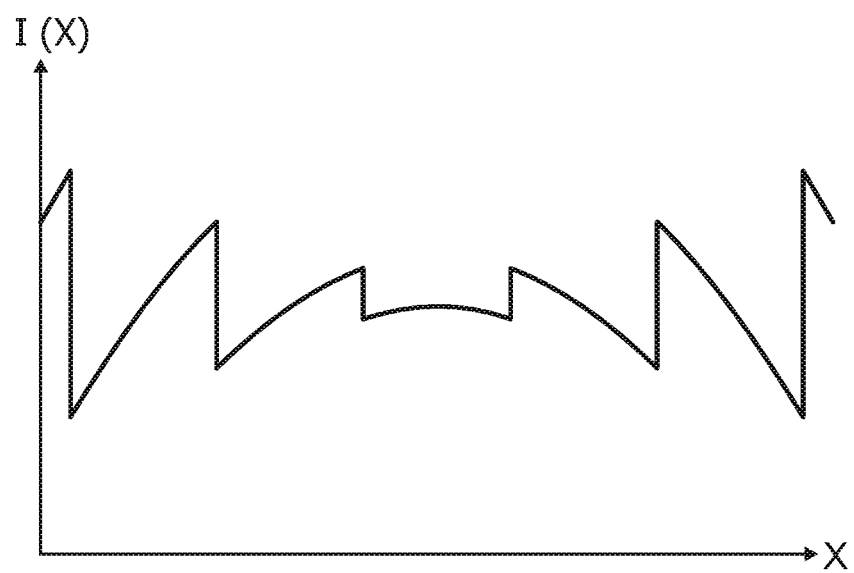

FIG. 4a shows the profile from FIG. 3 again together with the fingers 71 of the intensity variation device 70. An exact correction of the intensity distribution is carried out at the places highlighted by points on the intensity profile I(x), but not in the regions therebetween, such that as a result, as indicated in FIG. 4b, a scan-integrated intensity profile I(x) embodied in a zigzag fashion is obtained after a correction by the fingers 71.

The disclosure provides, then, for correcting the uncorrectable portions of the intensity profile via a correction of structures on the lithography mask 30.

To demonstrate the advantages, three different projection exposure apparatuses 100 according to the disclosure are considered below, which differ in the intensity distribution generated by the light source 61 on the field facet mirror 62. These projection exposure apparatuses can differ for example in the source plasma 611 or in the collector 612.

It is known that, for producing desired structures on a wafer 50 in a lithography process, firstly a mask 30 has to be "designed". This means that structure sizes on the mask 30 have to be calculated, to be precise on the basis of the knowledge about the desired structures that are intended to be produced on the wafer 50, and on the basis of an assumption about a scan-integrated illumination intensity distribution and a scan-integrated illumination direction distribution (also referred to as "illumination pupil"). If the mask 30 is illuminated exactly with this illumination intensity distribution and illumination direction distribution during the lithography process, structures having exactly the desired size arise on the wafer 50. The assumed illumination intensity distribution and/or illumination direction distribution often differ(s) from the actual illumination intensity distribution and/or illumination direction distribution because taking account of the actual illumination intensity distribution and/or illumination direction distribution would be too complicated.

The structures considered in the following exemplary embodiment are 18 nm wide lines having a pitch of between 36 nm and 126 nm. 100 different structures are considered, to be precise in each case 50 different pitches in horizontal and vertical orientations. This means that a mask 30 is considered via which 100 different structures are intended to be able to be produced on the wafer 50, and each of said structures is intended to be produced in a large number at different locations on the wafer 50. Accordingly, the nomenclature "location dependence of a structure size" is therefore well defined hereinafter.

Before the mask design, a spatially substantially constant intensity profile of the illumination of the reticle is set via the intensity variation device 70, such that a uniformity is corrected. This can also be carried out by simulation. In this case, a position of the fingers 71 of the intensity variation device 70 is sought in such a way that substantially the same scan-integrated intensity is obtained at all locations in the object field. Since the fingers 71 can be moved only along one direction and thus only one degree of freedom is present, per finger 71 it is also possible for only the scan-integrated intensity at one location PU to be chosen freely. It is assumed that this location PU is situated in each case in the center of the finger. This also corresponds to the illustration in FIG. 4a. Of all the locations P, therefore, it is only at specific locations PU, the number of which is determined by the number of fingers 71, that a desired intensity can be ensured.

Since the illumination direction distribution and the illumination intensity are not constant spatially, in the case of a mask design under the issues indicated above at each location a different structure width would arise on the mask 30 if the same structure were intended to be printed on the wafer 50. On account of the high numerical complexity of a mask design, an exact calculation of the widths $b_M$ of the structures on the mask 30 at each location of the mask is only rarely practicable.

The following two known options are investigated:

1. At each of the for example 25 locations PU, an exact mask design is carried out, that is to say that per finger 71 of the intensity variation device 70 the widths $b_M$ of the structures on the mask are calculated on the basis of the scan-integrated illumination intensity and the scan-integrated illumination direction distribution. The calculation of the image generated by the structures on the mask 30 via the projection optical unit 10 in the image plane 40 is also referred to as "aerial image calculation".

The corresponding widths are used at each location P that is covered by the relevant finger.

2. A mask design is carried out only in the center of the object field (location P0), wherein these structure widths are then used for each location on the mask 30.

Figure 5A:
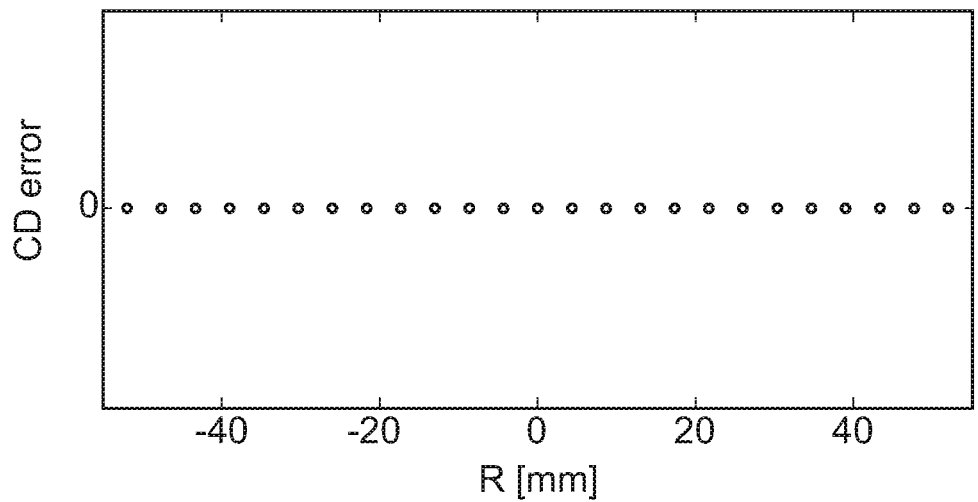
FIGS. 5a and 5b show CD errors in the case of a mask design at each location PU at which an independent intensity adaptation is possible, and respectively only in the field center (P0), evaluated at all locations PU at which an independent intensity adaptation is possible.
Figure 5B:
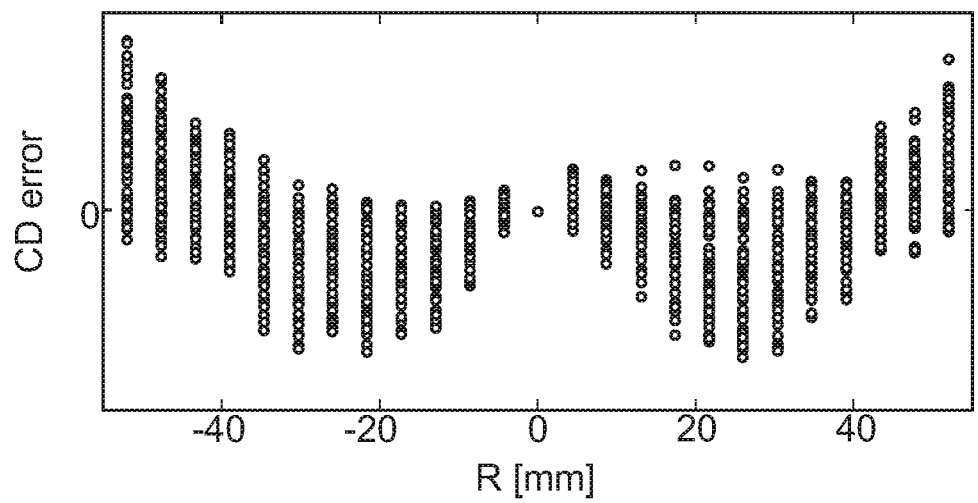

FIGS. 5a and 5b show from a qualitative standpoint structure size deviations of the structures produced on the wafer 50, that is to say a deviation between the desired extent of the structures and their actual extent. The coordinate R runs parallel to the x-axis, that is to say orthogonally to the scan direction. The structure size deviation is also referred to as "CD error". FIGS. 5a and 5b only illustrate the structure size deviations at the locations PU, that is to say that the profile of the structure size error between the locations PU is not depicted in FIGS. 5a and 5b.

It is evident in FIG. 5a that for the case where a mask design is carried out at each location PU, precisely the desired structure widths arise at each location PU for all considered structures on the wafer. The CD error is thus equal to zero at all locations PU. If, by contrast, as shown in FIG. 5b, a mask design is carried out only at an individual location P0, namely in the field center (at R=0 mm), then the CD error is equal to zero for all structures only in the field center. A finite CD error arises for all other locations. 100 points are depicted for each location PU (corresponding to one point per structure), but said points are in part superimposed in the figure and are therefore not all discernible as individual points.

The mask design is based on a calculation of aerial images and is therefore numerically demanding. Therefore, rule-based mask adaptations are used by mask manufacturers to reduce the computational complexity. Said adaptations involve taking a mask 30 designed via one or a few aerial image calculations and adapting it via simple numerical rules. On account of the simplicity of these rules, this type of mask adaptation advantageously involves only a low computation time.

The CD error for locations P situated between the locations PU was not depicted in FIG. 5. CD errors for locations P situated between the locations PU are additionally illustrated qualitatively in FIGS. 6a and 6b. The curve profiles show the CD error for the different structures as a function of the location. 100 curves are depicted, wherein each individual line corresponds to a structure. The value of the CD error at the locations PU is marked by points, which means that each point at the corresponding locations PU lies on the corresponding curve.

Figure 6A:
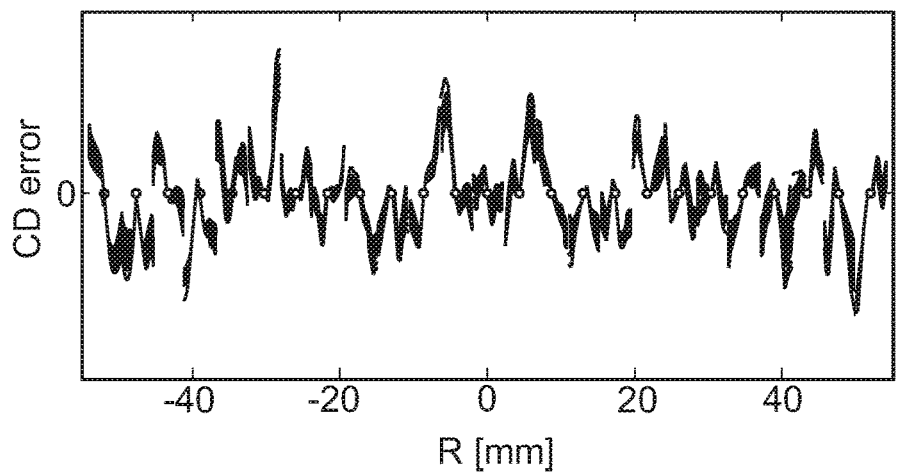
FIGS. 6a and 6b show CD errors in the case of a mask design at each location PU at which an independent intensity adaptation is possible, and respectively only in the field center (P0), evaluated at all locations.
Figure 6B:
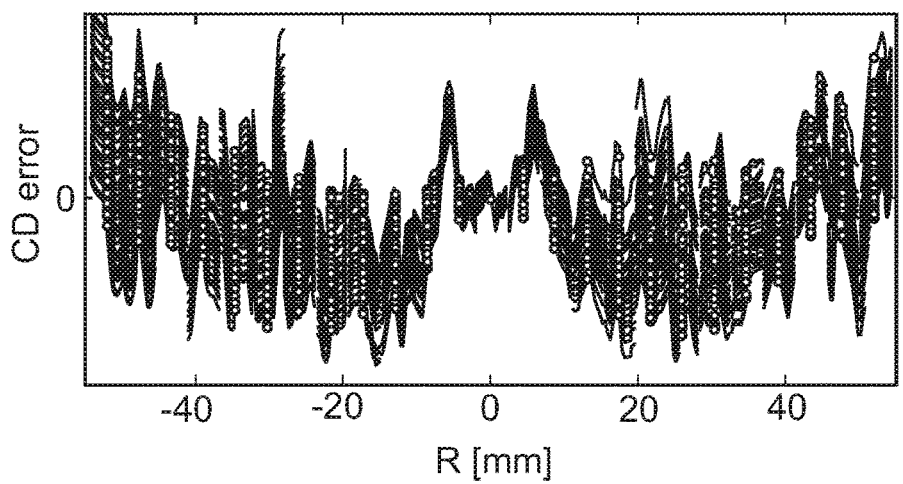

It is evident that a significant CD error arises even in the case of a mask design at each location PU (see FIG. 6a). The main cause of this is the restrictedness of a uniformity of the local intensity that is achievable via the intensity variation device 70. The CD error is even more pronounced in the case of a mask design only in the field center (see FIG. 6b), since in particular location dependences of the illumination direction distribution are added here.

Figure 7:
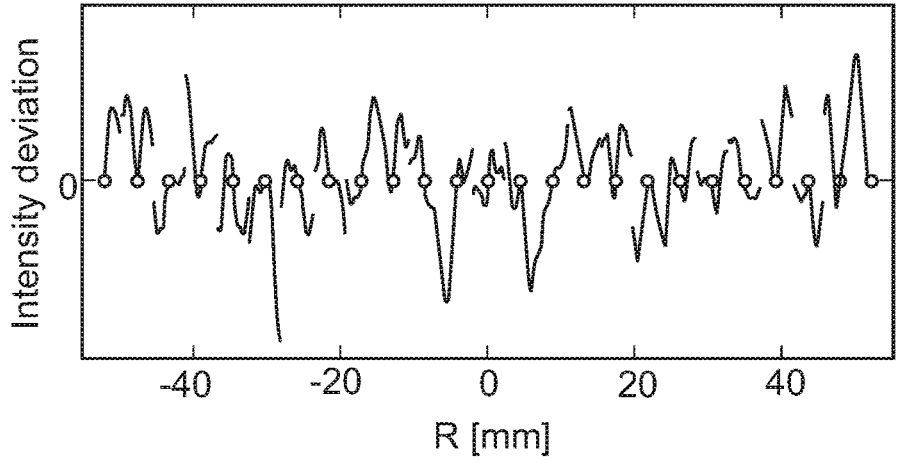
FIG. 7 shows an illumination intensity profile over the mask after a correction via an intensity variation device.

Inhomogeneities of the illumination intensity, after an above-described correction of the intensity profile has been carried out via an intensity variation device 70, as a function of the location are illustrated qualitatively in FIG. 7. At the locations P between the center points PU of the fingers 71, the corresponding finger 71 has a position that is not optimal. The jumps in the curve mark the places at which a finger 71 of the intensity variation device 70 ends and an adjacent finger 71 begins. FIG. 7 corresponds to FIG. 4b for a different embodiment of the shape of the fingers 71.

Upon a systematic investigation of the CD errors achieved via conventional mask designs, the results illustrated qualitatively in FIGS. 8a to 8c and 12a to 12c arise for the CD errors.

FIGS. 8a to 8c and 12a to 12c respectively illustrate three profiles of CD errors for three different lithography apparatuses 100 that differ in the properties of the light source 61. These three different situations are designated as A, B and C. The different light sources lead to different intensity profiles and illumination direction distributions with which the object field is illuminated. The dashed lines indicate the minimum and the maximum of the structure size error over the ensemble of the 100 different structures. The values at the locations PU are indicated by horizontal error bars.

Figure 8A:
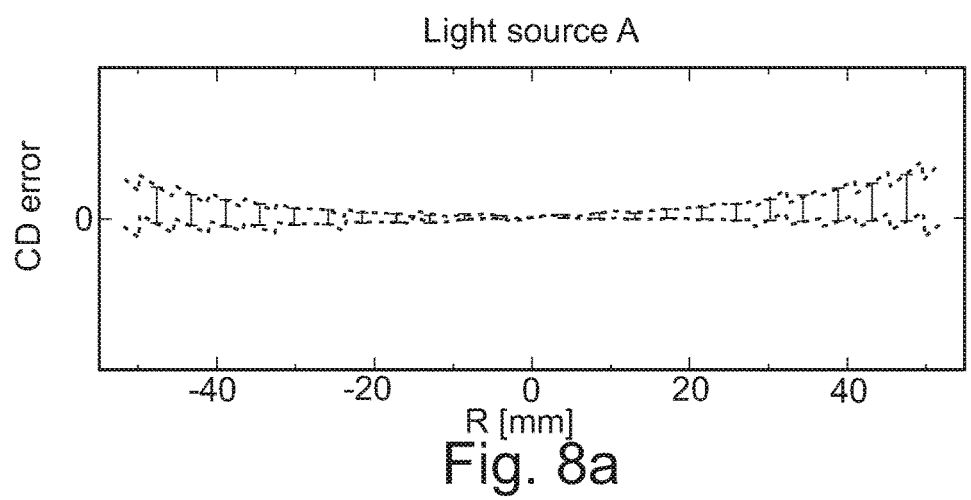
FIGS. 8a to 8c show CD errors in the case of a conventional mask design only in the field center.
Figure 8B:
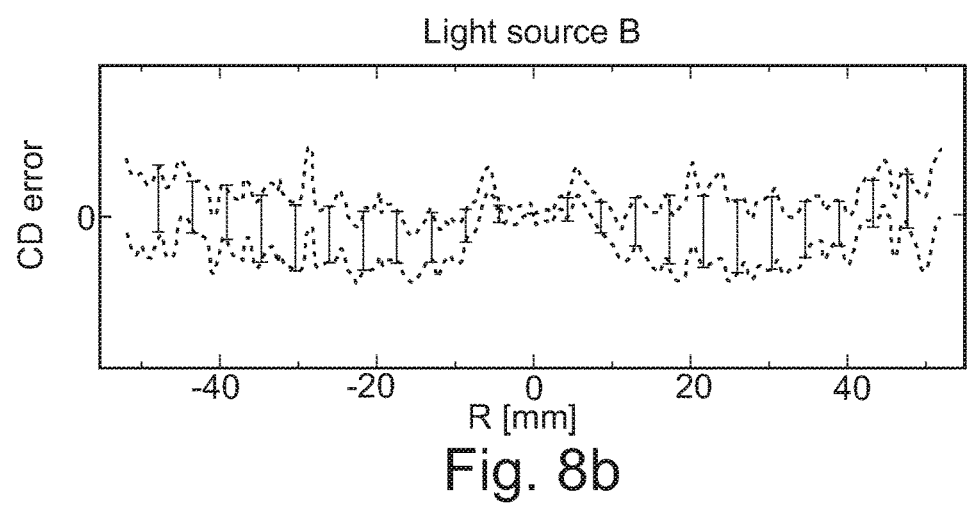
Figure 8C:
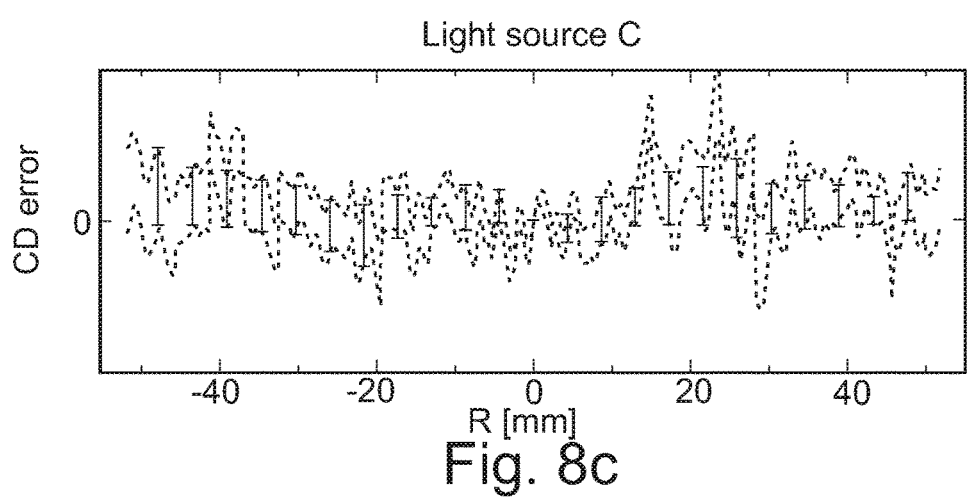
Figure 9A:
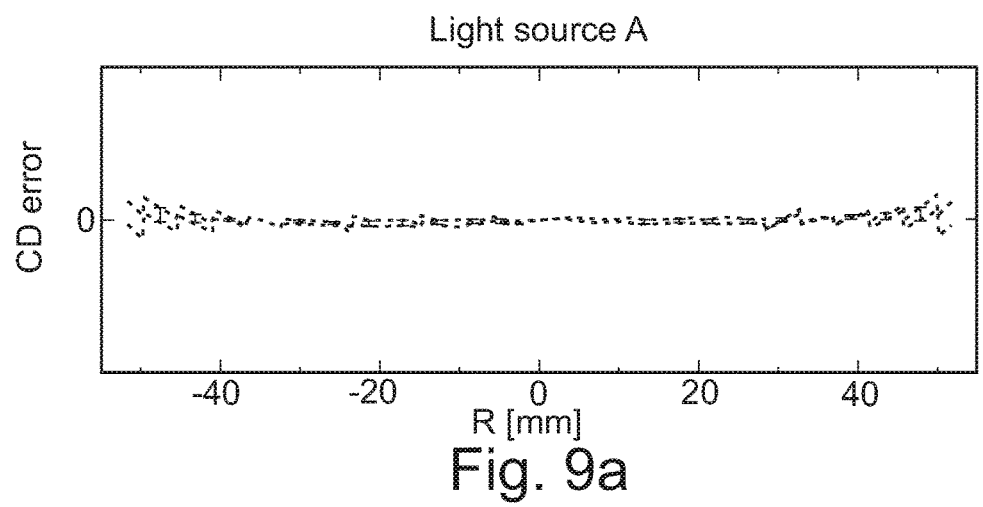
FIGS. 9a to 9c show CD errors reduced according to the disclosure in the case of a linear interpolation of structure sizes in the case of a mask design in the field center and +/−⅔ field width.
Figure 9B:
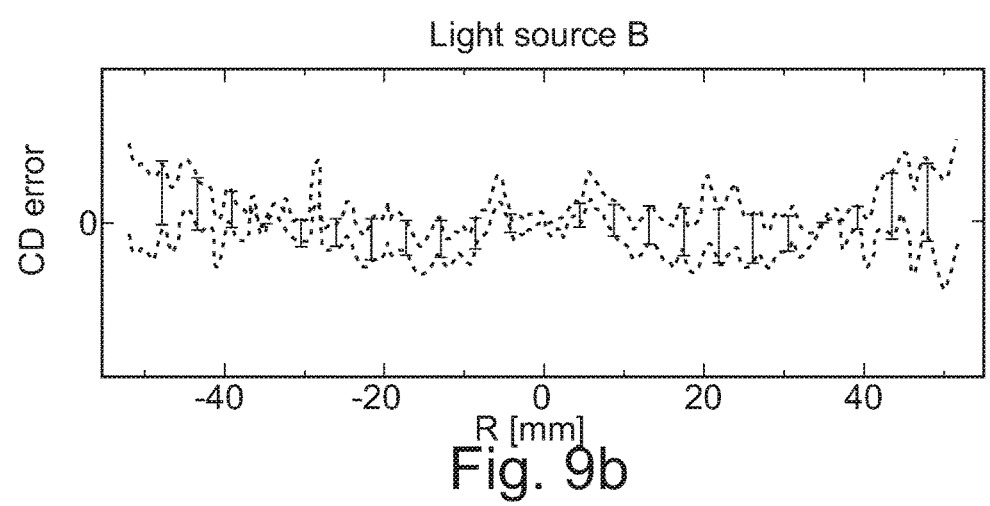
Figure 9C:
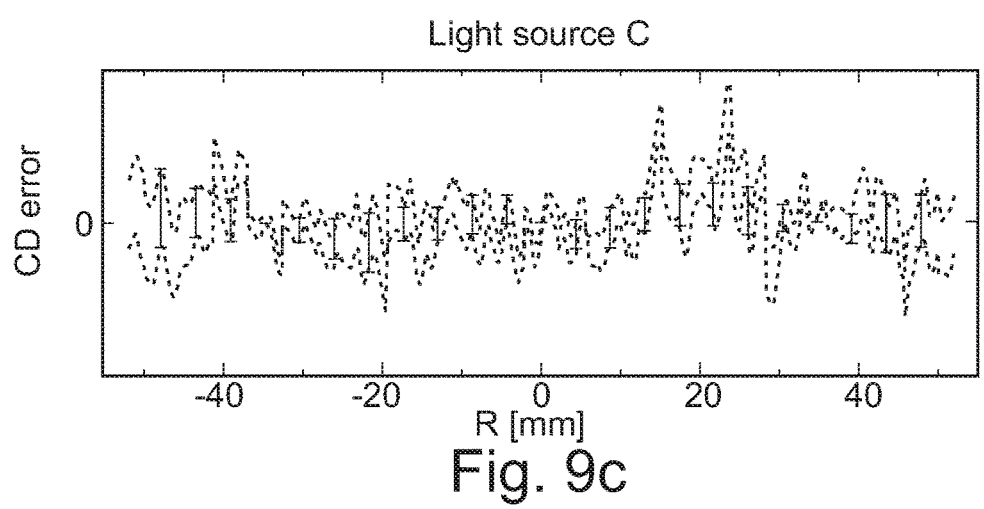
Figure 12A:
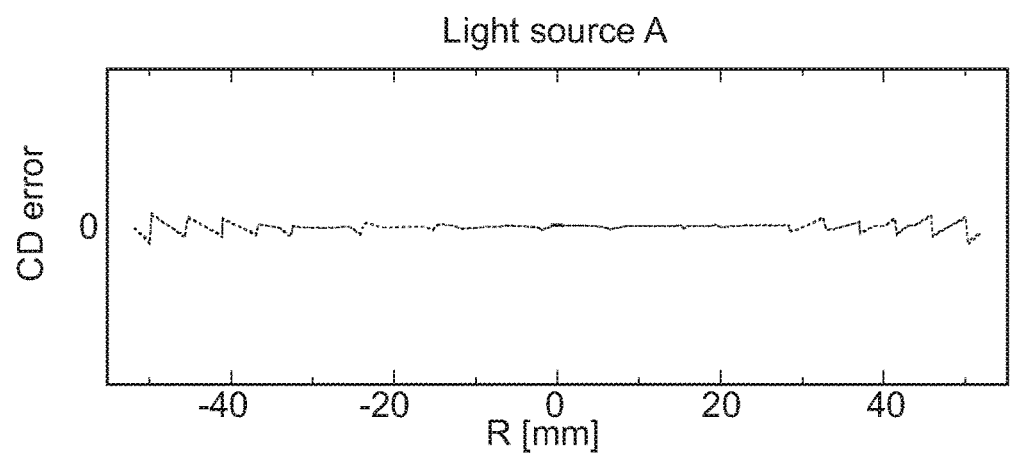
FIGS. 12a to 12c show CD errors in the case of a conventional mask design at each position of fingers of the intensity variation device.
Figure 12B:
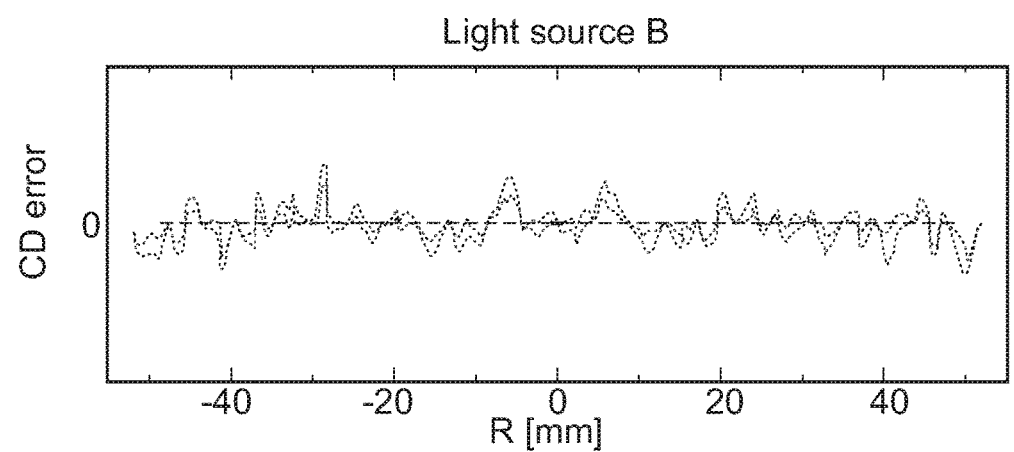
Figure 12C:
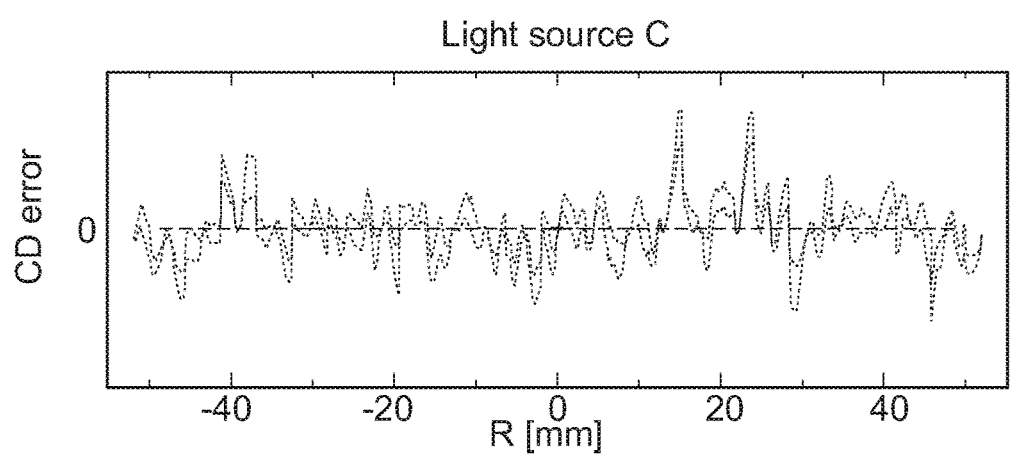

FIGS. 8a to 8c illustrate CD errors if a mask design is carried out only in an individual location P0, namely in the field center. FIGS. 12a to 12c illustrate profiles of CD errors if a mask design is carried out at each location PU, that is to say at each finger 71 of the intensity variation device 70. This is therefore a comprehensive illustration analogous to FIGS. 6b and 6a. The locations at which a mask design is carried out are designated as PM hereinafter. PU always denotes the locations at which a correction of the scan-integrated intensity is carried out. In FIGS. 8a to 8c, therefore, PM=P0 and PM≠PU. In FIGS. 12a to 12c, PM=PU.

The significantly reduced CD errors in FIGS. 12a to 12c compared with FIGS. 8a to 8c are clearly discernible.

As already mentioned further above, a main reason for the large values of the CD errors at locations P between the locations PU is the variation of the illumination intensity over the width of each finger 71 of the intensity variation device 70 and to a certain degree also the variation of the illumination direction distribution between the locations PM or outside the location PM.

An intensity variation ΔI can be converted into a prediction for the CD variation ΔCD of a structure via the so-called NILS (standing for Normalized Intensity Logarithm Squared) in accordance with the following mathematical relationship:

$$\frac{\Delta CD}{CD} = \frac{2}{NILS} \times \frac{\Delta I}{I} \quad (1)$$

The NILS can be calculated directly from the profile I(x) of the aerial image intensity of the relevant structure in accordance with the following mathematical relationship:

$$NILS = \frac{CD}{I(xo)} \times \frac{I(x)}{x} \text{ for } x = x0 \quad (2)$$

wherein the expression is calculated at the position x0 at which the line edge is intended to be printed. The variable NILS (and also the variable MEEF also introduced later) are standard variables in lithography process development. They are described for example in the textbook "Fundamental Principles of Optical Lithography" by Chris Mack, John Wiley & Sons, ISBN 978-0-470-72730-0.

The NILS value for each structure can thus be calculated without additional complexity in the case of the mask design, this often already taking place automatically.

Via equation (1), therefore, an intensity profile as shown in FIG. 7, for example, can be converted into a prediction for the CD error caused thereby. This prediction can then be used to adapt the structure sizes on the mask 30 in such a way that the CD error is compensated for in a relatively complete manner.

The so-called MEEF (standing for Mask Error Enhancement Factor) indicates the extent to which the width of a structure printed on the wafer changes if the width b of a structure on the mask 30 changes. The following holds true for the CD variation:

$$\Delta CD = \beta \times MEEF \times \Delta b \quad (3)$$

Other known definitions of the MEEF include the magnification scale β in the variable of the MEEF. The MEEF, too, can advantageously be calculated without additional complexity during the mask design.

The values for NILS and MEEF are thus available for each structure separately at each location PM at which a mask design was carried out. By combining equations (1) and (3), it is thus possible to calculate a correction of the mask widths which compensates for the effect of the spatial intensity variation:

$$\Delta b(x) = \frac{2 \times CD \times MEEF}{\beta \times NILS} \times \frac{\Delta I(x)}{I} \quad (4)$$

If the correction is carried out in accordance with equation (4), then the results achieved according to the disclosure arise, as illustrated qualitatively in FIGS. 9 to 11 and 13 to 17.

Equation (4) describes a rule-based mask adaptation which is advantageously implementable without relatively great complexity for a correction of structure sizes on the mask 30. Moreover, this procedure advantageously does not require a change in the known processes of the mask manufacturers.

Figure 13A:
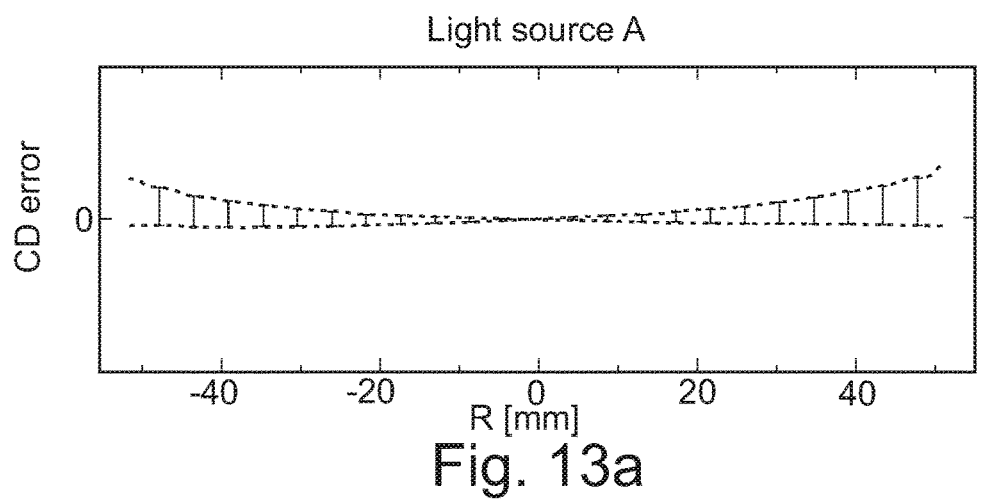
FIGS. 13a to 13c show CD errors reduced according to the disclosure in the case of a correction of the structure widths in the case of a mask design only in the field center.
Figure 13B:
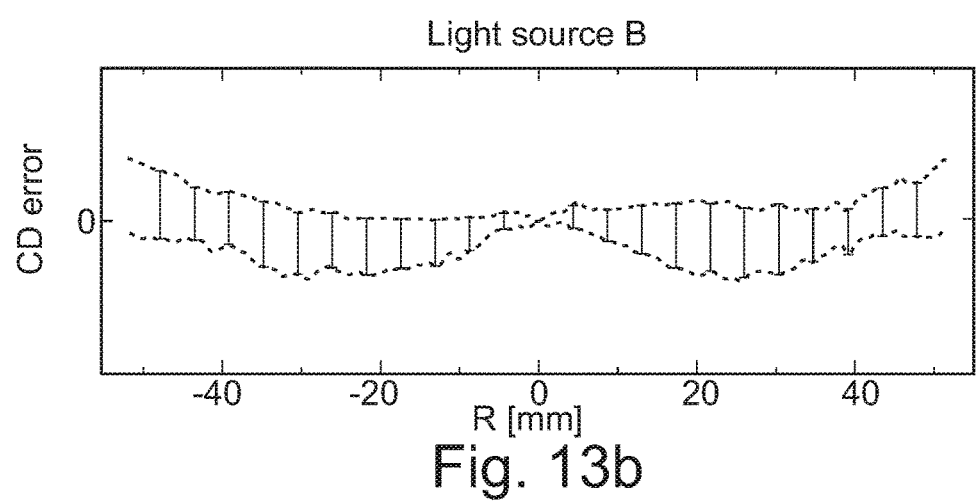
Figure 13C:
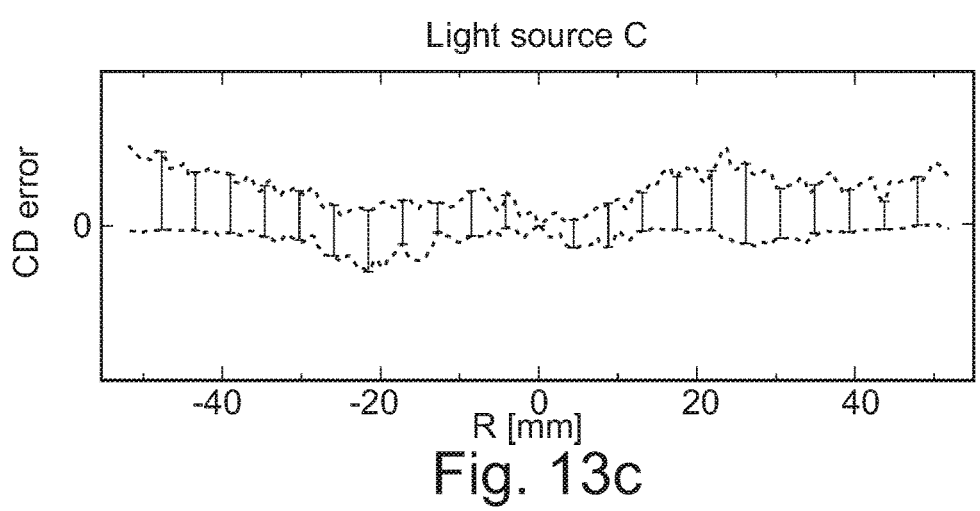
Figure 14A:
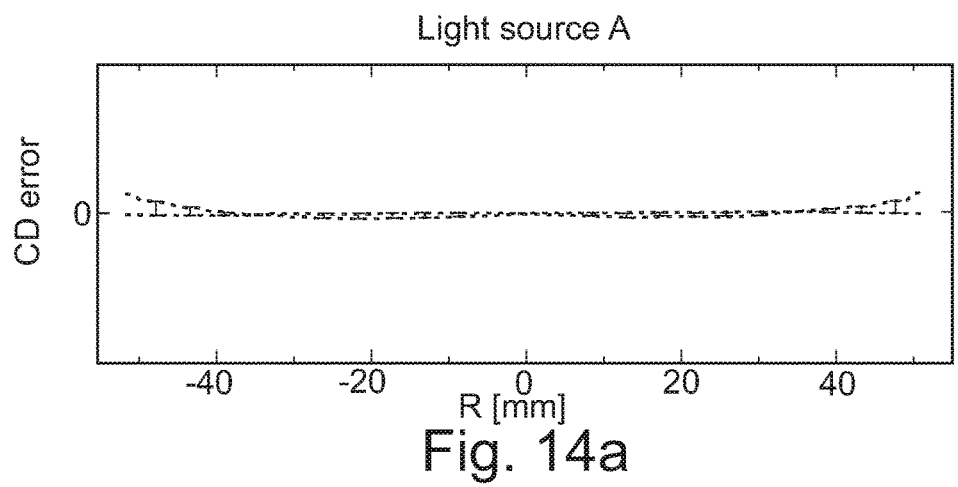
FIGS. 14a to 14c show CD errors reduced according to the disclosure in the case of a correction according to equation (4) and subsequent linear interpolation in the case of a mask design in the field center and +/−⅔ field width.
Figure 14B:
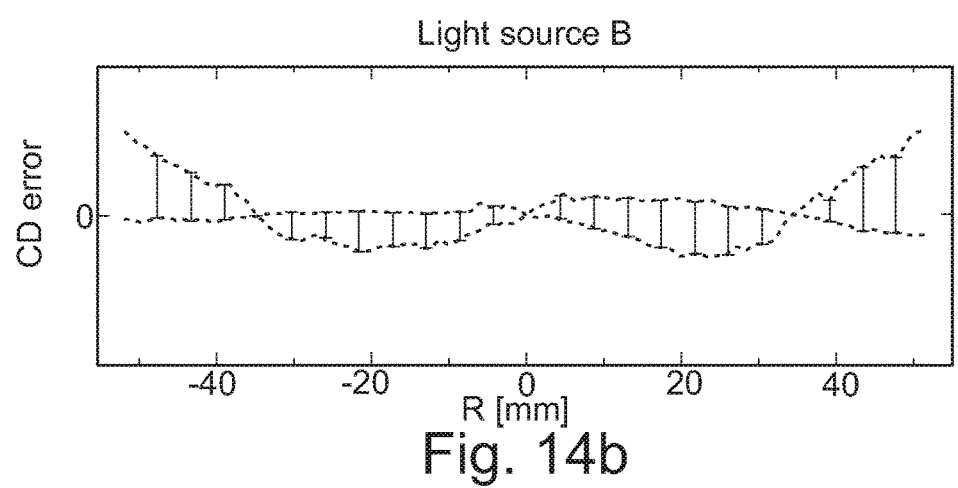
Figure 14C:
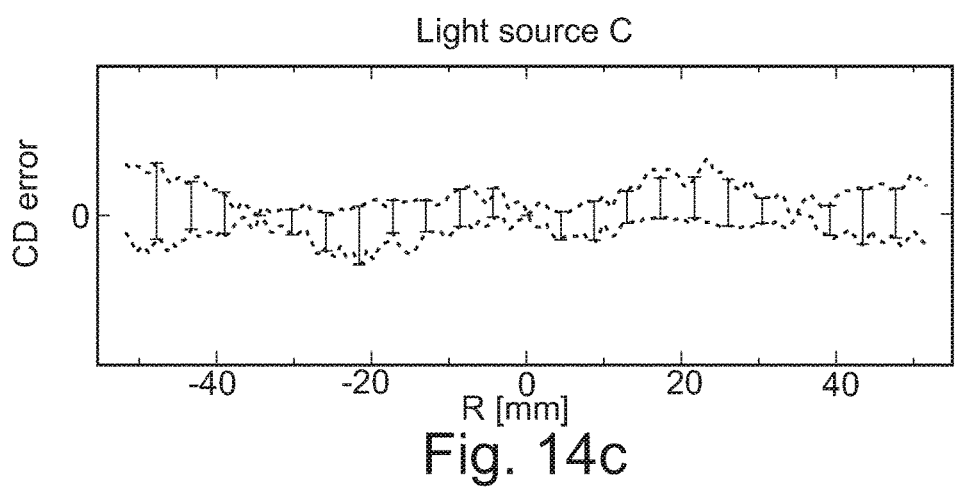
Figure 17A:
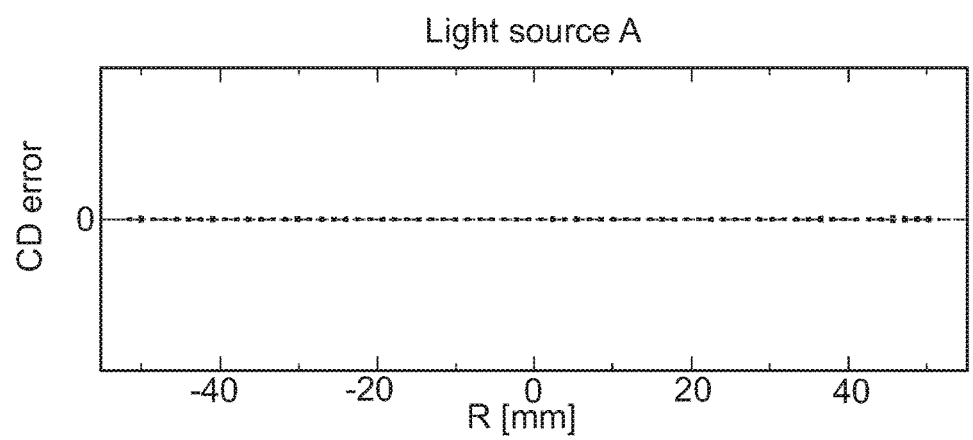
FIGS. 17a to 17c show CD errors reduced according to the disclosure in the case of a correction according to equation (4) in the case of a mask design at each finger of the intensity variation device.
Figure 17B:
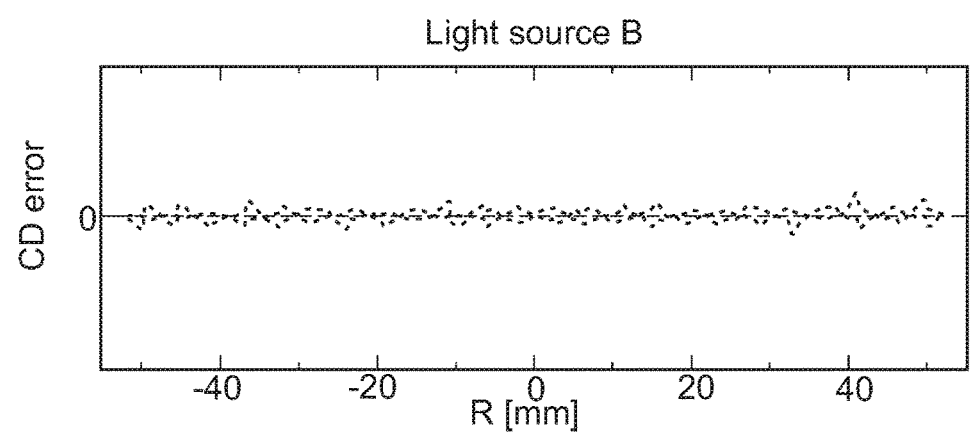
Figure 17C:
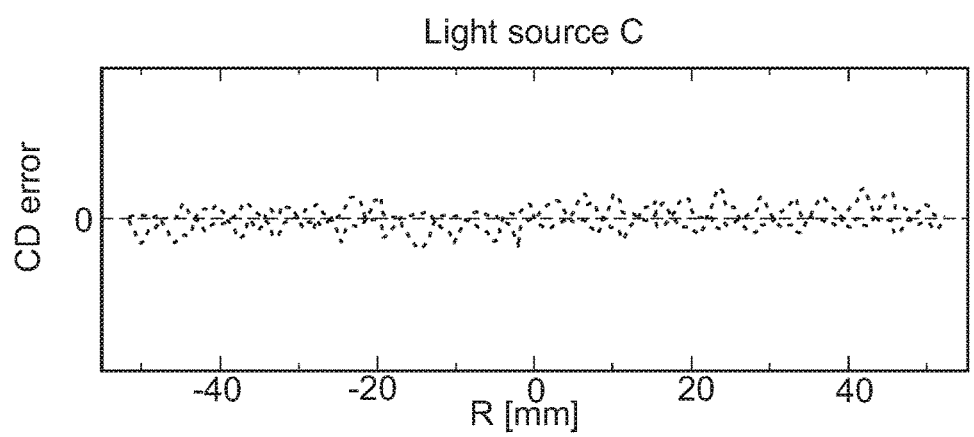

Profiles of CD errors reduced according to the disclosure are illustrated in FIGS. 13a to 13c and 17a to 17c. In this case, FIGS. 13a to 13c illustrate profiles of the CD error when carrying out the correction according to equation (4) in the case of a mask design only in the field center, that is to say that for PM=P0 an exact calculation is carried out and a correction in accordance with equation (4) is subsequently carried out for all locations P. FIGS. 17a to 17c illustrate profiles of the CD error in the case of a mask design at each location PU with a subsequent correction at each location P according to equation (4).

The correction method proposed according to the disclosure cannot become better than the value of the CD errors that results at the locations PU of the fingers 71 of the intensity variation device 70. This minimum CD error results from the location-dependent alteration of the illumination direction distribution.

If a mask design is carried out at each location PU (see FIGS. 12a to 12c and 17a to 17c), this minimum CD error becomes equal to zero. The comparison of FIGS. 17a to 17c with FIGS. 12a to 12c reveals that the CD error can be reduced by an order of magnitude via the correction of the structure sizes according to equation (4).

If, by contrast, a mask design is carried out only in the field center, then the minimum CD error is distinctly greater. Even if the reduction of the high-frequency contribution to the CD error is similarly good, that is to say that the absolute difference between the CD errors in FIGS. 8a to 8c and 13a to 13c is of approximately the same magnitude as the difference between the CD errors in FIGS. 12a to 12c and 17a to 17c, the relative reduction of the total CD error is only a factor of 2. This can be accounted for by the fact that the CD errors in FIG. 12 are already very small, but the mask design disadvantageously involves a very great computational complexity and is therefore rarely used in practice.

The two options described above were that a mask design is carried out either at each location PU or only in the field center P0, that is to say that the two options were PM=PU and PM=P0. The variant of carrying out a mask design at each location PU cannot always be practicable either, on account of the computational complexity. If, by contrast, the mask 30 is designed only in the field center via aerial image calculations, then the CD error that arises as a result of the field dependence of the illumination direction distribution and is not correctable by equation (4) can be undesirably great, depending on the application and light source 61.

Therefore, as a further alternative, a third option is also proposed, which provides for the mask design to be carried out at a small number of locations PM, for example at three locations. With the use of three locations PM, the latter can lie for example in the field center and +/−2/3 of the reticle radius and respectively +/−4/5 of the reticle radius. The sizes of structures on the mask 30 which are intended to produce structures of identical size on the wafer before a correction according to equation (4) is then possibly also carried out are determined by a predefined interpolation (e.g. linear, quadratic, parabolic, etc. interpolation) of the structure size on the mask 30 at locations PM. The structure sizes on the mask 30 at all locations PM or else only the structure sizes at some of the locations PM can be used for the interpolation at a location. By way of example, with the use of three points PM, the structure size can be interpolated parabolically, or linear interpolation can be carried out between two adjacent points of the three points PM. The use of only two design locations PM is also conceivable, just like the use of more than three design locations PM is possible.

FIGS. 9a to 9c and 14a to 14c show CD errors reduced according to the disclosure with (FIGS. 14a to 14c) and respectively without (FIGS. 9a to 9c) use of the correction measure in accordance with equation (4). In the figures it is accordingly discernible, in particular, that the CD error is equal to zero at the three selected mask design locations PM in the field center and +/−2/3 field width (i.e. at 0 and approximately +/−35 mm).

A further alternative is to place in each case two of the three mask design support points at the edge of the used reticle region. This choice is appropriate, in particular, if the profile of the CD error is determined by the behavior at the edge.

Figure 10A:
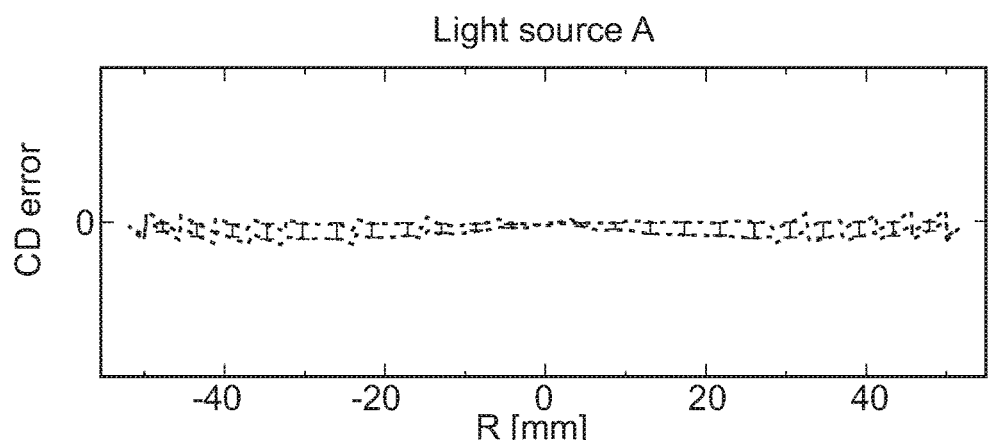
FIGS. 10a to 10c show CD errors reduced according to the disclosure in the case of a linear interpolation of structure sizes in the case of a mask design in the field center and at the field edge.
Figure 10B:
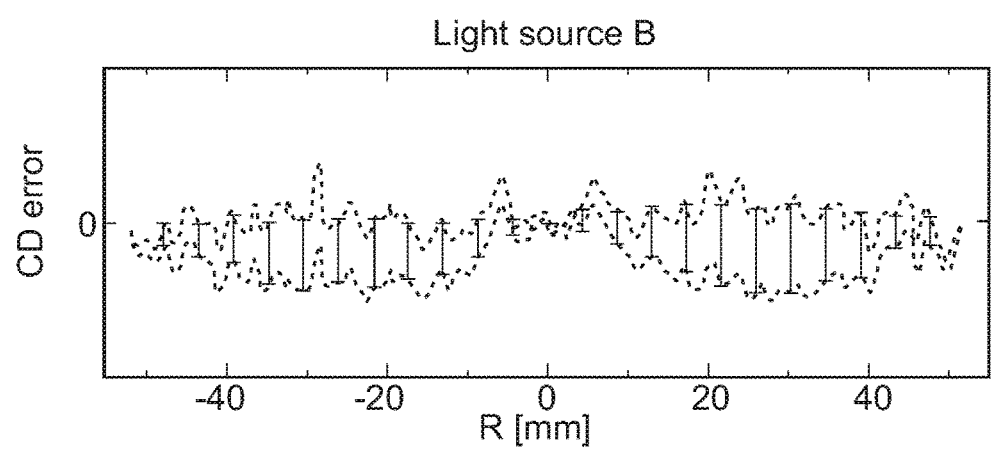
Figure 10C:
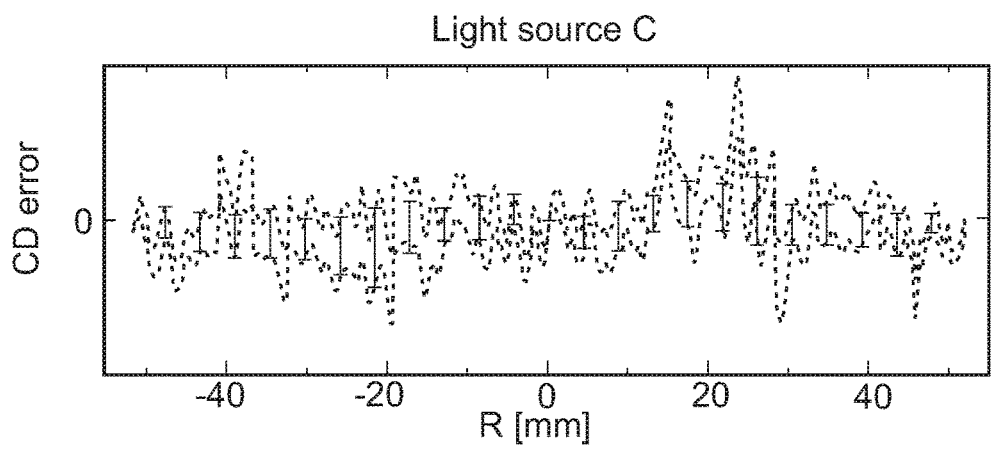
Figure 11A:
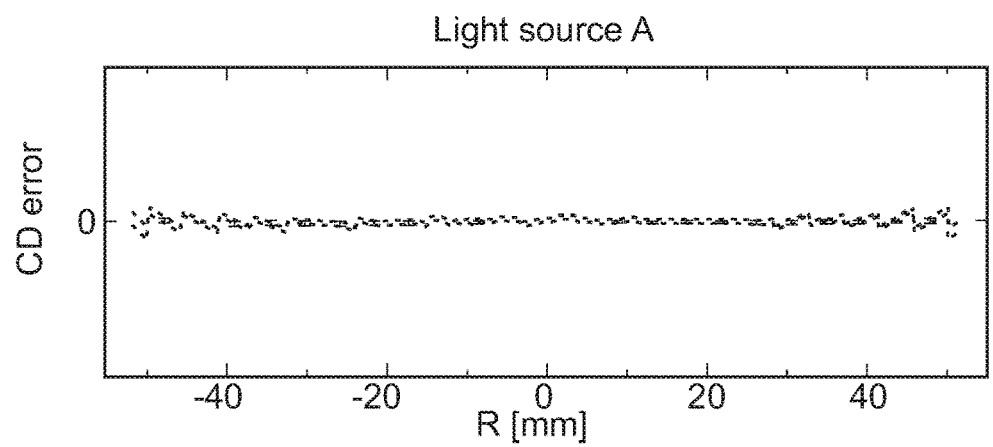
FIGS. 11a to 11c show CD errors reduced according to the disclosure in the case of a quadratic interpolation of structure sizes in the case of a mask design in the field center and +/−⅘ field width.
Figure 11B:
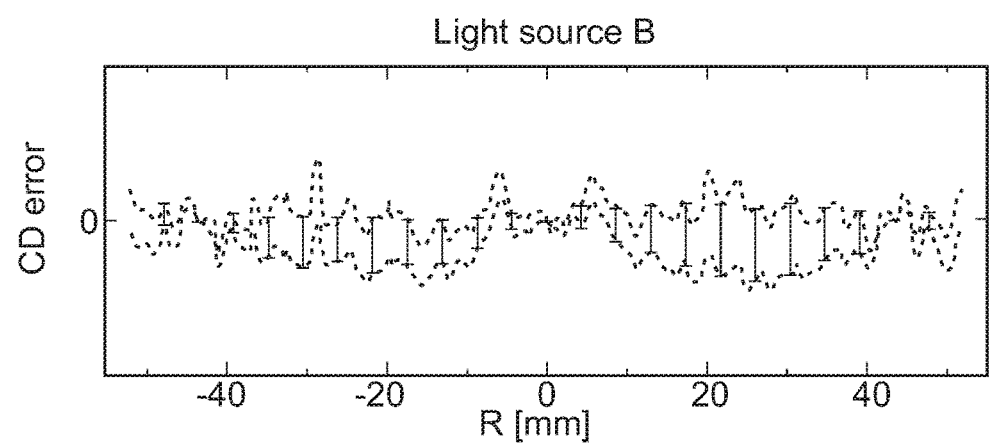
Figure 11C:
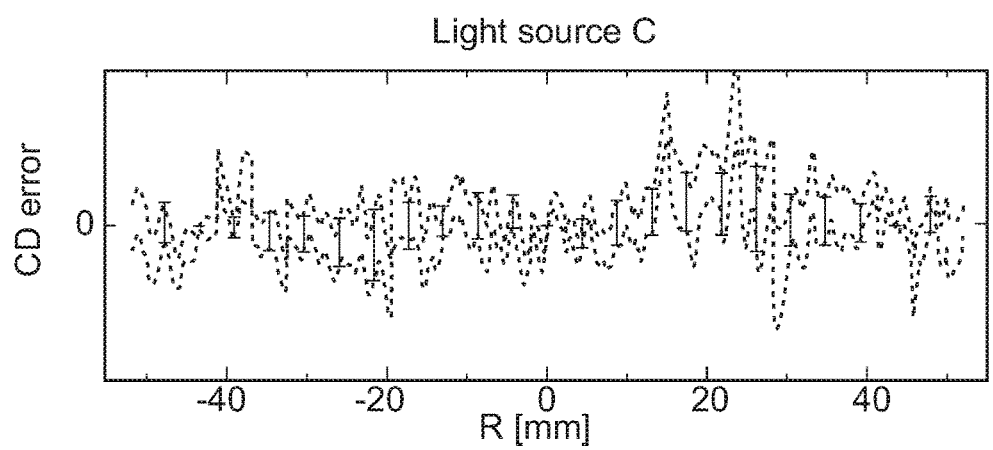
Figure 15A:
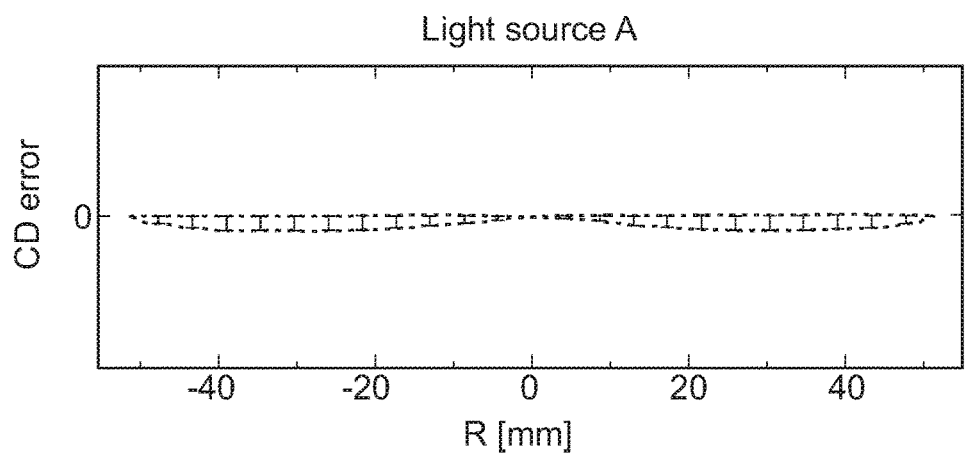
FIGS. 15a to 15c show CD errors reduced according to the disclosure in the case of a correction according to equation (4) and subsequent linear interpolation in the case of a mask design in the field center and at the field edge.
Figure 15B:
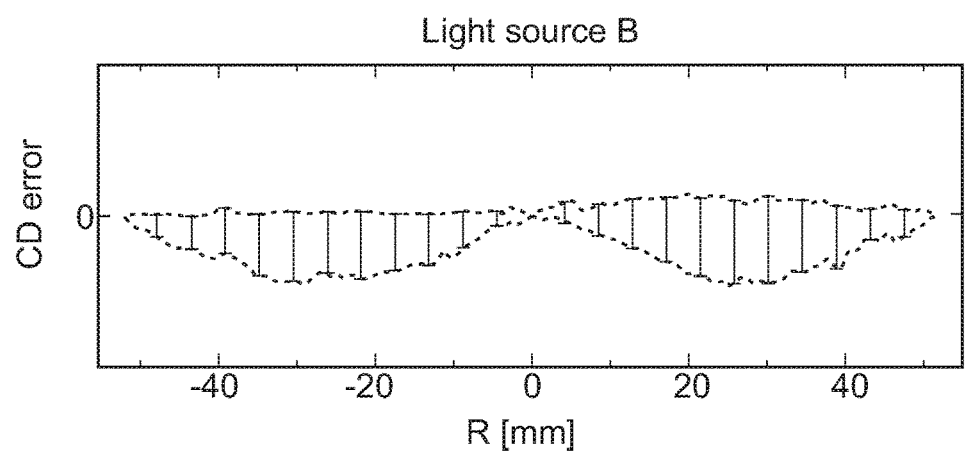
Figure 15C:
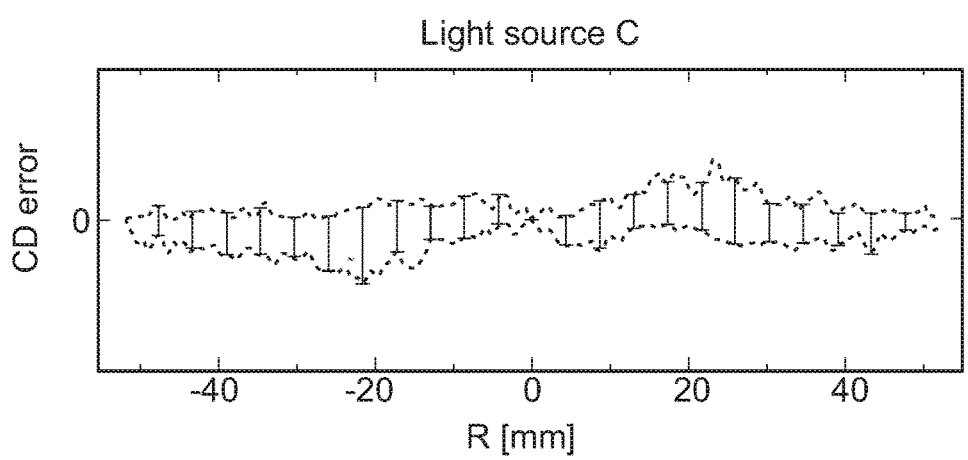
Figure 16A:
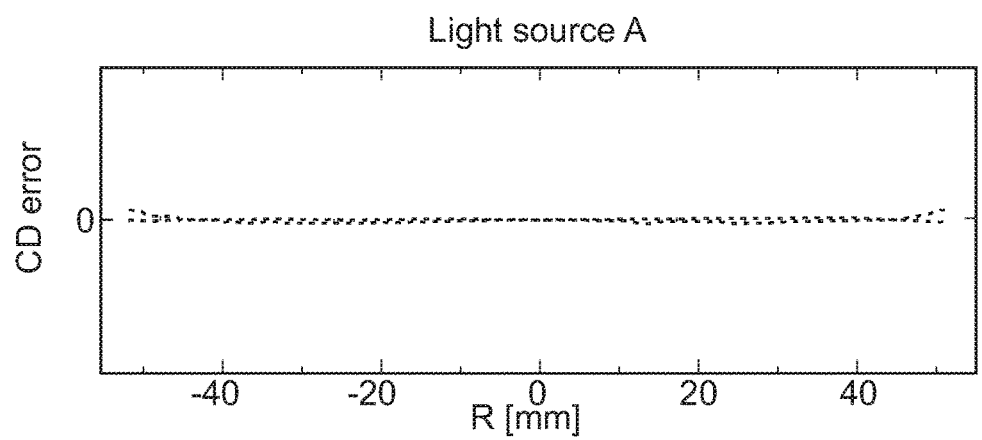
FIGS. 16a to 16c show CD errors reduced according to the disclosure in the case of a correction according to equation (4) and subsequent quadratic interpolation in the case of a mask design in the field center and +/−⅘ field width.
Figure 16B:
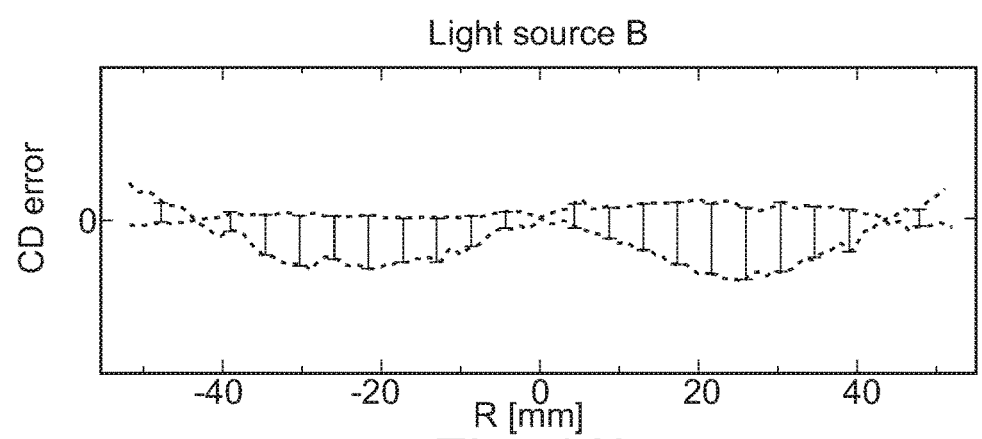
Figure 16C:
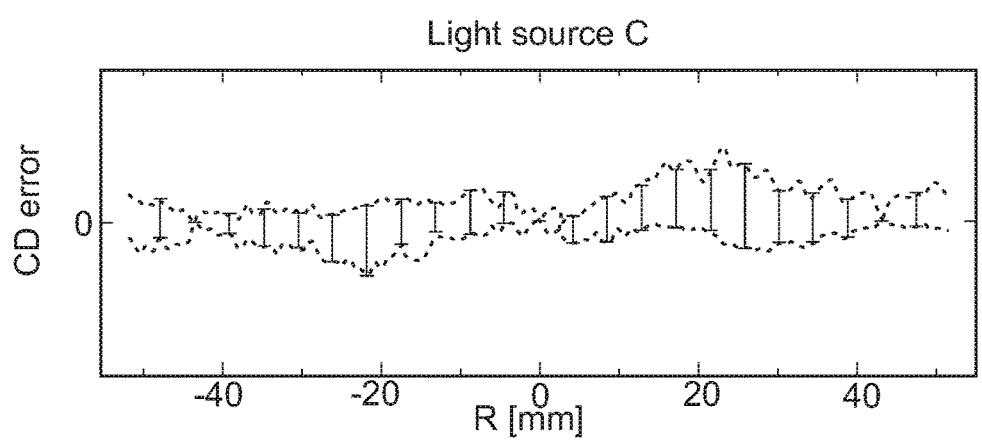

This case is illustrated in FIGS. 10a to 10c and 15a to 15c. Here FIGS. 10a to 10c illustrate a mask design with subsequent linear interpolation between the design locations PM for three different light sources A, B and C. FIGS. 15a to 15c illustrate a mask design with linear interpolation and correction measure according to equation (4) for the three light sources A, B and C.

As a further alternative, FIGS. 11a to 11c and 16a to 16c also illustrate profiles of CD errors in the case of a mask design in the field center and for +/−4/5 field width. In this case, a quadratic interpolation between said design locations PM was carried out in FIGS. 11a to 11c. A correction of the structure widths in accordance with equation (4) was also carried out as well in FIGS. 16a to 16c.

To summarize, a system for producing structures in a wafer via a projection exposure apparatus and a lithography mask is proposed with which high-frequency contributions to a CD error can be substantially completely removed by rule-based mask adaptations being carried out. Such rule-based mask adaptations are standard processes for mask manufacturers, wherein the rules—proposed according to the disclosure—of the correction according to equation (4) or of the interpolation can advantageously be carried out without high additional complexity.

As a result, what remains as a residual effect for the CD error is a long-range, i.e. low-frequency, curve profile having a typical period of approximately half a reticle width. This residual effect could be completely removed if a mask design were carried out at sufficiently many field points. However, this is often impracticable owing to the computational complexity. Therefore, it was shown as a modification that a significant improvement in the CD error can be achieved with a mask design at only three locations with subsequent mask design correction.

It is thus advantageously possible, via the system according to the disclosure, with simple rule-based correction methods involving little computational complexity for a lithography mask, to produce improved structures on wafers which interact better with known illumination systems (e.g. EUV or VUV projection exposure systems) or can utilize the possibilities thereof better.

The person skilled in the art will suitably modify the described features or combine them with one another, without departing from the essence of the disclosure.

What is claimed is:

1. A system, comprising:
  a projection exposure apparatus, comprising:
    a projection optical unit configured to image an object field into an image field; and
    an illumination system configured to guide illumination light toward the object field,
  wherein the projection exposure apparatus is configured so that, during operation of the projection exposure apparatus:
    the illumination light at the object field has a scan-integrated intensity distribution in a direction perpendicular to a scan direction and a scan-integrated direction distribution in the direction orthogonal to the scan direction;
    mask structures of the lithography mask are imaged to provide substrate structures on a substrate in the image field;
    a size of the mask structures at defined mask design locations is based on an intensity distribution of the illumination light at the object field and from a direction distribution of the illumination light at the object field; and
    the size of a mask structure between the mask design locations is given by a sum of an interpolation of the values of the sizes of the mask structures at the mask design locations plus a term which, apart from a proportionality factor, is given by the profile of the scan-integrated intensity distribution.

2. The system of claim 1, further comprising:
a mask holder configured to hold the lithography mask in the object field; and
a substrate holder configured to hold the substrate in the image field,
wherein the mask holder is displaceable along the scan direction, and the substrate holder is displaceable along the scan direction.

3. The system of claim 2, wherein the projection exposure apparatus is configured so that, during operation of the projection exposure apparatus, the size of a mask structure on the lithography mask between the mask design locations is given as a sum of an interpolation of the size of the mask structures at the mask design locations plus a term ($\Delta b(x)$) given by the following mathematical relationship:

$$\Delta b(x) = \frac{2 \cdot CD \cdot MEEF}{\beta \cdot NILS} \cdot \frac{\Delta I(x)}{I}$$

wherein:
CD represents a desired structure width on the substrate;
MEEF is a mask error enhancement factor;
NILS is a normalized intensity logarithm squared;
$\beta$ is an absolute value of the magnification scale of the projection optical unit; and
$\Delta I(x)/I$ is a relative intensity deviation as a function of the x-coordinate.

4. The system of claim 3, further comprising an intensity variation device, wherein the projection exposure apparatus is configured so that, during operation of the projection exposure apparatus, a number of the mask design locations is identical to a number of the locations at which an independent correction of a scan-integrated intensity is possible via the intensity variation device.

5. The system of claim 1, wherein the projection exposure apparatus is configured so that, during operation of the projection exposure apparatus, the size of a mask structure on the lithography mask between the mask design locations is given as a sum of an interpolation of the size of the mask structures at the mask design locations plus a term ($\Delta b(x)$) given by the following mathematical relationship:

$$\Delta b(x) = \frac{2 \cdot CD \cdot MEEF}{\beta \cdot NILS} \cdot \frac{\Delta I(x)}{I}$$

wherein:
CD represents a desired structure width on the substrate;
MEEF is a mask error enhancement factor;
NILS is a normalized intensity logarithm squared;
$\beta$ is an absolute value of the magnification scale of the projection optical unit; and
$\Delta I(x)/I$ is a relative intensity deviation as a function of the x-coordinate.

6. The system of claim 5, further comprising an intensity variation device, wherein the projection exposure apparatus is configured so that, during operation of the projection exposure apparatus, a number of the mask design locations is identical to a number of the locations at which an independent correction of a scan-integrated intensity is possible via the intensity variation device.

7. The system of claim 1, further comprising an intensity variation device, wherein the projection exposure apparatus is configured so that, during operation of the projection exposure apparatus, a number of the mask design locations is identical to a number of the locations at which an independent correction of a scan-integrated intensity is possible via the intensity variation device.

8. A method, comprising:
providing the system of claim 1;
using the illumination system to illuminate the mask structures; and
using the projection objective to image the mask structures on the substrate to provide the substrate structures.

9. A system, comprising:
a projection exposure apparatus, comprising:
a projection optical unit configured to image an object field into an image field;
an illumination system configured to guide illumination light toward the object field,
wherein the projection exposure apparatus is configured so that, during operation of the projection exposure apparatus:
the illumination light at the object field has a scan-integrated intensity distribution in a direction perpendicular to a scan direction and a scan-integrated direction distribution in the direction orthogonal to the scan direction;
mask structures of a lithography mask are imaged to provide substrate structures on a substrate;
a size of the mask structures on the lithography mask at defined mask design locations is determined from the intensity distribution of the illumination light at the object field and from the direction distribution of the illumination light at the object field; and
the size of the mask structures on the lithography mask between the mask design locations is an interpolation of the sizes of the mask structures at the mask design locations.

10. The system of claim 9, further comprising:
a mask holder configured to hold a lithography mask arrangeable in the object field; and
a substrate holder configured to hold a substrate in the image field,
wherein the mask holder is displaceable along the scan direction, and the substrate holder is displaceable along the scan direction.

11. The system of claim 10, wherein the illumination system comprises an intensity variation device configured so that, during use of the projection exposure apparatus, the intensity variation device varies the scan-integrated intensity distribution of the illumination light at the object field.

12. The system of claim 11, wherein the scan-integrated intensity of the illumination light is of identical magnitude at at least three locations of the object field that are spaced apart from one another.

13. The system of claim 9, wherein the illumination system comprises an intensity variation device configured so that, during use of the projection exposure apparatus, the intensity variation device varies the scan-integrated intensity distribution of the illumination light at the object field.

14. The system of claim 13, wherein the scan-integrated intensity of the illumination light is of identical magnitude at at least three locations of the object field that are spaced apart from one another.

15. A method, comprising:
providing the system of claim 9;

using the illumination system to illuminate the mask structures; and using the projection objective to image the mask structures on the substrate to provide the substrate structures.

16. A system, including:

a projection exposure apparatus, comprising:
   a projection optical unit configured to image an object field into an image field;
   an illumination system configured to guide illumination light toward the object field, wherein:
   the illumination system comprises an intensity variation device configured so that, during use of the projection exposure apparatus, the intensity variation device varies the scan-integrated intensity distribution of the illumination light at the object field;
   at the object field, the illumination light has a scan-integrated intensity distribution and with a scan-integrated direction distribution;
   the projection objective is configured so that, during use of the projection exposure apparatus, mask structures of the lithography mask are imaged to provide substrate structures on the substrate; and
   the lithography mask is subdividable into disjoint regions in which the mask structure size variation is proportional to the scan-integrated intensity variation.

17. The system of claim 16, further comprising:

a mask holder configured to hold a lithography mask arrangeable in the object field; and a substrate holder configured to hold a substrate in the image field, wherein the mask holder is displaceable along the scan direction, and the substrate holder is displaceable along the scan direction.

18. The system of claim 17, wherein the projection exposure apparatus is configured so that, during operation of the projection exposure apparatus, the size of a mask structure on the lithography mask between the mask design locations is given as a sum of an interpolation of the size of the mask structures at the mask design locations plus a term ($\Delta b(x)$) given by the following mathematical relationship:

$$\Delta b(x) = \frac{2 \cdot CD \cdot MEEF}{\beta \cdot NILS} \cdot \frac{\Delta I(x)}{I}$$

wherein:
   CD represents a desired structure width on the substrate;
   MEEF is a mask error enhancement factor;
   NILS is a normalized intensity logarithm squared;
   $\beta$ is an absolute value of the magnification scale of the projection optical unit; and
   $\Delta I(x)/I$ is a relative intensity deviation as a function of the x-coordinate.

19. The system of claim 16, wherein the projection exposure apparatus is configured so that, during operation of the projection exposure apparatus, the size of a mask structure on the lithography mask between the mask design locations is given as a sum of an interpolation of the size of the mask structures at the mask design locations plus a term ($\Delta b(x)$) given by the following mathematical relationship:

$$\Delta b(x) = \frac{2 \cdot CD \cdot MEEF}{\beta \cdot NILS} \cdot \frac{\Delta I(x)}{I}$$

wherein:
   CD represents a desired structure width on the substrate;
   MEEF is a mask error enhancement factor;
   NILS is a normalized intensity logarithm squared;
   $\beta$ is an absolute value of the magnification scale of the projection optical unit; and
   $\Delta I(x)/I$ is a relative intensity deviation as a function of the x-coordinate.

20. A method, comprising:

providing the system of claim 16;

using the illumination system to illuminate the mask structures; and using the projection objective to image the mask structures on the substrate to provide the substrate structures.

* * * * *